US012489412B2

(12) United States Patent
Yamaguchi et al.

(10) Patent No.: US 12,489,412 B2
(45) Date of Patent: Dec. 2, 2025

(54) METHOD FOR MANUFACTURING VIBRATION ELEMENT

(71) Applicant: SEIKO EPSON CORPORATION, Tokyo (JP)

(72) Inventors: Keiichi Yamaguchi, Ina (JP); Hiyori Sakata, Minowa (JP); Shigeru Shiraishi, Ina (JP); Ryuta Nishizawa, Nagano (JP)

(73) Assignee: SEIKO EPSON CORPORATION (JP)

( * ) Notice: Subject to any disclaimer, the term of this patent is extended or adjusted under 35 U.S.C. 154(b) by 548 days.

(21) Appl. No.: 17/974,653

(22) Filed: Oct. 27, 2022

(65) Prior Publication Data

US 2023/0139098 A1    May 4, 2023

(30) Foreign Application Priority Data

Oct. 28, 2021    (JP) .................................. 2021-176208

(51) Int. Cl.
*H03H 3/02* (2006.01)
*H03H 9/215* (2006.01)

(52) U.S. Cl.
CPC .............. *H03H 3/02* (2013.01); *H03H 9/215* (2013.01); *H03H 2003/026* (2013.01)

(58) Field of Classification Search
CPC ........ H10N 30/082; H10N 30/06; H03H 9/21; H03H 9/215; H03H 2003/026; H03H 3/02
See application file for complete search history.

(56) References Cited

U.S. PATENT DOCUMENTS

| 4,472,654 A | * | 9/1984 | Nakamura | ................ H03H 9/21 310/312 |
| 6,046,531 A | * | 4/2000 | Kikuchi | ............. G01C 19/5621 73/504.03 |
| 6,881,649 B2 | * | 4/2005 | Kouma | .............. G02B 26/0841 438/460 |
| 7,482,277 B2 | * | 1/2009 | Barwicz | ............ H01L 21/76813 438/720 |

(Continued)

FOREIGN PATENT DOCUMENTS

| JP | 2007-013382 A | 1/2007 |
| JP | 2007329879 A | * 12/2007 |

(Continued)

*Primary Examiner* — Jeffrey T Carley
(74) *Attorney, Agent, or Firm* — Harness, Dickey & Pierce, P.L.C.

(57) ABSTRACT

A method for manufacturing a vibration element including a first protective film formation step of forming a first protective film, a first dry etching step of performing dry etching via the first protective film to form first grooves and the outer shapes of vibrating arms, a second protective film formation step of forming a second protective film in the first grooves, a second dry etching step of performing dry etching via the second protective film, a third protective film formation step of forming a third protective film, a third dry etching step of performing dry etching via the third protective film to form second grooves and the outer shapes of the vibrating arms, a fourth protective film formation step of forming a fourth protective film in the second grooves, and a fourth dry etching step of performing dry etching via the fourth protective film.

8 Claims, 18 Drawing Sheets

(56) References Cited

U.S. PATENT DOCUMENTS

| | | | | |
|---|---|---|---|---|
| 7,553,609 B2* | 6/2009 | Aratake | ............... | H03H 9/0595 |
| | | | | 430/318 |
| 7,857,983 B2* | 12/2010 | Hirano | ..................... | H03H 3/04 |
| | | | | 29/25.35 |
| 7,861,387 B2* | 1/2011 | Hokibara | ................ | C03C 15/00 |
| | | | | 430/314 |
| 7,948,156 B2* | 5/2011 | Satoh | ..................... | H03H 9/21 |
| | | | | 310/365 |
| 8,134,284 B2* | 3/2012 | Kawanishi | ........... | H03H 9/1021 |
| | | | | 310/370 |
| 8,156,621 B2* | 4/2012 | Iwai | ......................... | C23F 1/14 |
| | | | | 29/25.35 |
| 8,183,743 B2* | 5/2012 | Petrenko | ................ | H02N 2/002 |
| | | | | 310/317 |
| 8,365,371 B2* | 2/2013 | Amano | ................. | H10N 30/06 |
| | | | | 29/25.35 |
| 8,373,333 B2* | 2/2013 | Yamada | ............. | H03H 9/02062 |
| | | | | 310/368 |
| 8,400,048 B2* | 3/2013 | Shirai | ..................... | H03H 9/21 |
| | | | | 73/504.16 |
| 8,580,126 B2* | 11/2013 | Sasaki | ................ | H03H 9/1014 |
| | | | | 216/2 |
| 10,072,928 B2* | 9/2018 | Ishii | ..................... | H10N 30/302 |
| 10,447,237 B2* | 10/2019 | Oga | ........................ | H03H 9/10 |
| 10,748,777 B2* | 8/2020 | Eom | ..................... | G02F 1/1345 |
| 11,584,641 B2* | 2/2023 | Tani | ..................... | G01P 15/131 |
| 12,078,813 B2* | 9/2024 | Ochiai | ............... | G02B 27/0994 |
| 12,213,381 B2* | 1/2025 | Sakata | ..................... | H03H 9/19 |
| 2003/0071542 A1* | 4/2003 | Satoh | ..................... | H03H 3/08 |
| | | | | 310/367 |
| 2005/0116586 A1* | 6/2005 | Tanaya | ..................... | H03H 9/21 |
| | | | | 310/348 |
| 2009/0152994 A1* | 6/2009 | Numata | ............... | H03H 9/1021 |
| | | | | 29/25.35 |
| 2009/0206704 A1* | 8/2009 | Kitamura | ............. | H03H 9/0547 |
| | | | | 310/357 |
| 2011/0227672 A1* | 9/2011 | Yamada | ............. | H03H 9/2478 |
| | | | | 310/370 |
| 2017/0126200 A1* | 5/2017 | Matsuo | ..................... | H03H 3/02 |

FOREIGN PATENT DOCUMENTS

| | | | | |
|---|---|---|---|---|
| JP | 2008-205657 A | | 9/2008 | |
| JP | 2010227817 A | * | 10/2010 | ............ H01L 41/29 |
| JP | 2013-175933 A | | 9/2013 | |
| JP | 2018-148380 A | | 9/2018 | |
| WO | WO-2006030900 A1 | * | 3/2006 | ............... H03H 3/04 |

* cited by examiner

METHOD FOR MANUFACTURING VIBRATION ELEMENT

The present application is based on, and claims priority from JP Application Serial Number 2021-176208, filed Oct. 28, 2021, the disclosure of which is hereby incorporated by reference herein in its entirety.

BACKGROUND

1. Technical Field

The present disclosure relates to a method for manufacturing a vibration element.

2. Related Art

JP-A-2013-175933 describes a method for forming a tuning-fork-type vibrator having a bottomed groove in each vibrating arm in wet and dry etching processes. In the manufacturing method described in JP-A-2013-175933, a quartz crystal substrate is wet-etched to form the outer shape of the tuning-fork-type vibrator, and the resultant structure is then dry-etched to form the grooves.

JP-A-2007-013382 describes a method for forming a tuning-fork-type vibrator having a bottomed groove in each vibrating arm in a dry etching process. In the manufacturing method described in JP-A-2007-013382, a substrate made of a piezoelectric material is so dry-etched that the width of the grooves is smaller than the width of the space between the pair of vibrating arms to allow the micro-loading effect to make the etched grooves shallower than the etched space between the pair of vibrating arms. The grooves and the outer shape of the vibrator are thus formed all at once.

In the manufacturing method described in JP-A-2013-175933, the wet etching process in which the outer shape is formed and the dry etching process in which the grooves are formed are separate processes, so that the manufacturing processes are complicated, and the grooves are likely to be misaligned with respect to the outer shape. Vibration elements manufactured by this method therefore have potential unwanted vibration and other problems.

On the other hand, in the manufacturing method described in JP-A-2007-013382, the outer shape and the grooves are formed all at once in the same step, so that the problem described above does not arise. This manufacturing method, however, uses the micro-loading effect in dry etching to form the outer shape and the grooves all at once, which causes restrictions on dimension setting, such as the width of the vibrating arms and the width and depth of the grooves, resulting in a problem of a decrease in design flexibility.

There is therefore a need for a vibration element manufacturing method that allows formation of the outer shape and the grooves of the vibration element all at once and provides a high degree of design flexibility.

SUMMARY

A method for manufacturing a vibration element according to an aspect of the present disclosure is a method for manufacturing a vibration element including a first vibrating arm and a second vibrating arm that extend along a first direction and are arranged side by side along a second direction that intersects with the first direction, the first and second vibrating arms each have a first surface and a second surface arranged side by side in a third direction intersecting the first direction and the second direction in a front and back relationship, a bottomed first groove opening to the first surface, and a bottomed second groove opening to the second surface, the method including a preparation step of preparing a quartz crystal substrate having a first substrate surface and a second substrate surface in a front and back relationship, a first protective film formation step of forming a first protective film at the first substrate surface in an area excluding a first groove forming region where the first grooves are formed from a first vibrating arm forming region where the first vibrating arm is formed and a second vibrating arm forming region where the second vibrating arm is formed, a first dry etching step of dry-etching the quartz crystal substrate from the first substrate surface side via the first protective film to form the first grooves and outer shapes of the first and second vibrating arms, a second protective film formation step of forming a second protective film in the first grooves, a second dry etching step of dry-etching the quartz crystal substrate from the first substrate surface side via the second protective film to form the first surface and the outer shapes of the first and second vibrating arms, a third protective film formation step of forming a third protective film at the second substrate surface in an area excluding a second groove forming region where the second grooves are formed from the first vibrating arm forming region and the second vibrating arm forming region, a third dry etching step of dry-etching the quartz crystal substrate from the second substrate surface side via the third protective film to form the second grooves and the outer shapes of the first and second vibrating arms, a fourth protective film formation step of forming a fourth protective film in the second grooves, and a fourth dry etching step of dry-etching the quartz crystal substrate from the second substrate surface side via the fourth protective film to form the second surface and the outer shapes of the first and second vibrating arms.

DESCRIPTION OF EXEMPLARY EMBODIMENTS

1. First Embodiment

A method for manufacturing a vibration element 1 according to a first embodiment will be described.

The configuration of the vibration element 1 will first be described with reference to FIGS. 1 and 2, and the method for manufacturing the vibration element 1 will next be described with reference to FIGS. 3 to 16.

Figure 3:
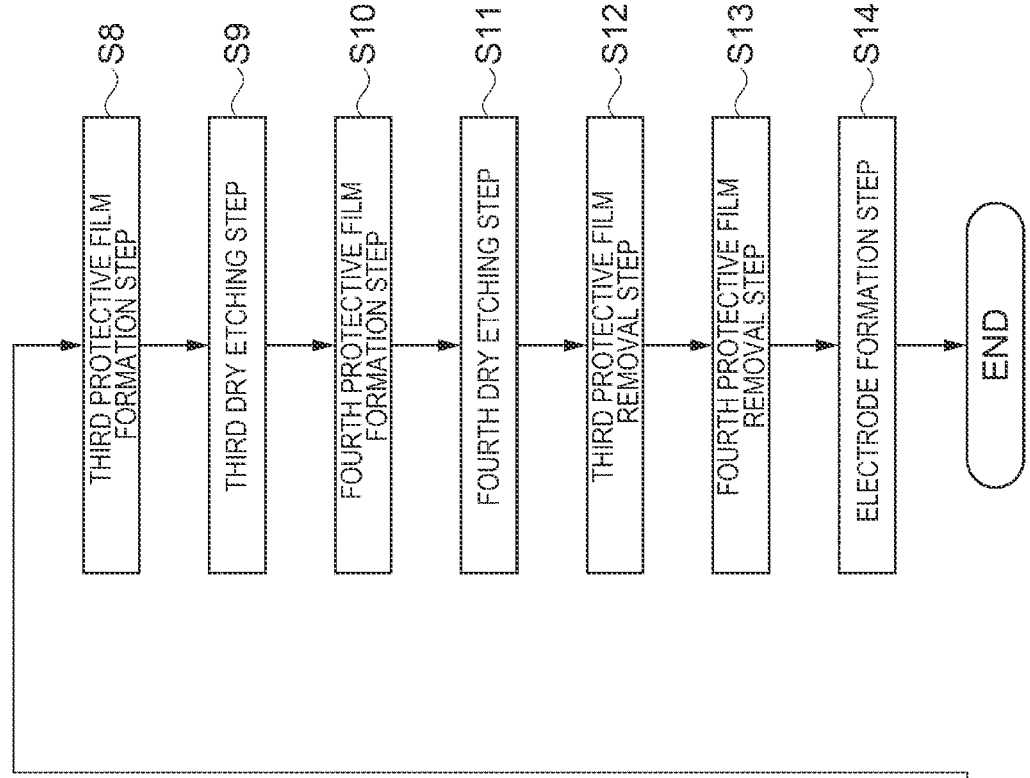
FIG. 3 shows steps of manufacturing the vibration element according to the first embodiment.
Figure 3:
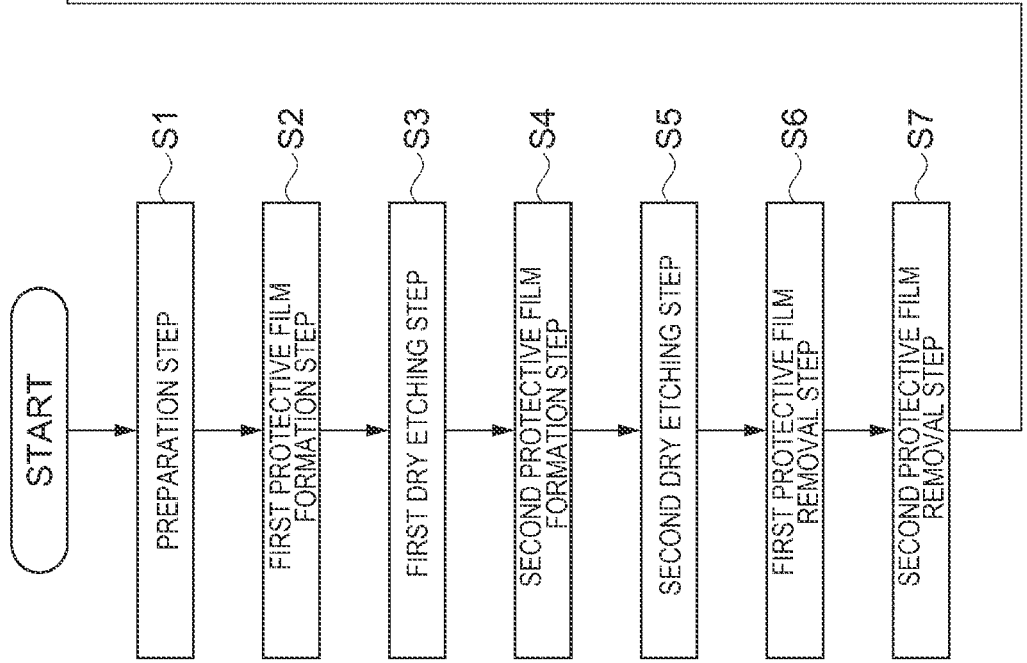

The figures excluding FIG. 3 show axes X, Y, and Z, which are three axes perpendicular to one another, for convenience of description. The direction along the axis X as a second direction is also called a direction X, the direction along the axis Y as a first direction is also called a direction Y, and the direction along the axis Z as a third direction is also called a direction Z. The side facing the arrow attached to each of the axes is also called a positive side, and the side opposite from the positive side is also called a negative side. The positive side of the direction Z is also called an "upper side", and the negative side of the direction Z is also called a "lower side". A plan view viewed in the direction Z is also simply called a "plan view". The axes X, Y, and Z correspond to the crystal axes of quartz crystal, as will be described later.

Figure 1:
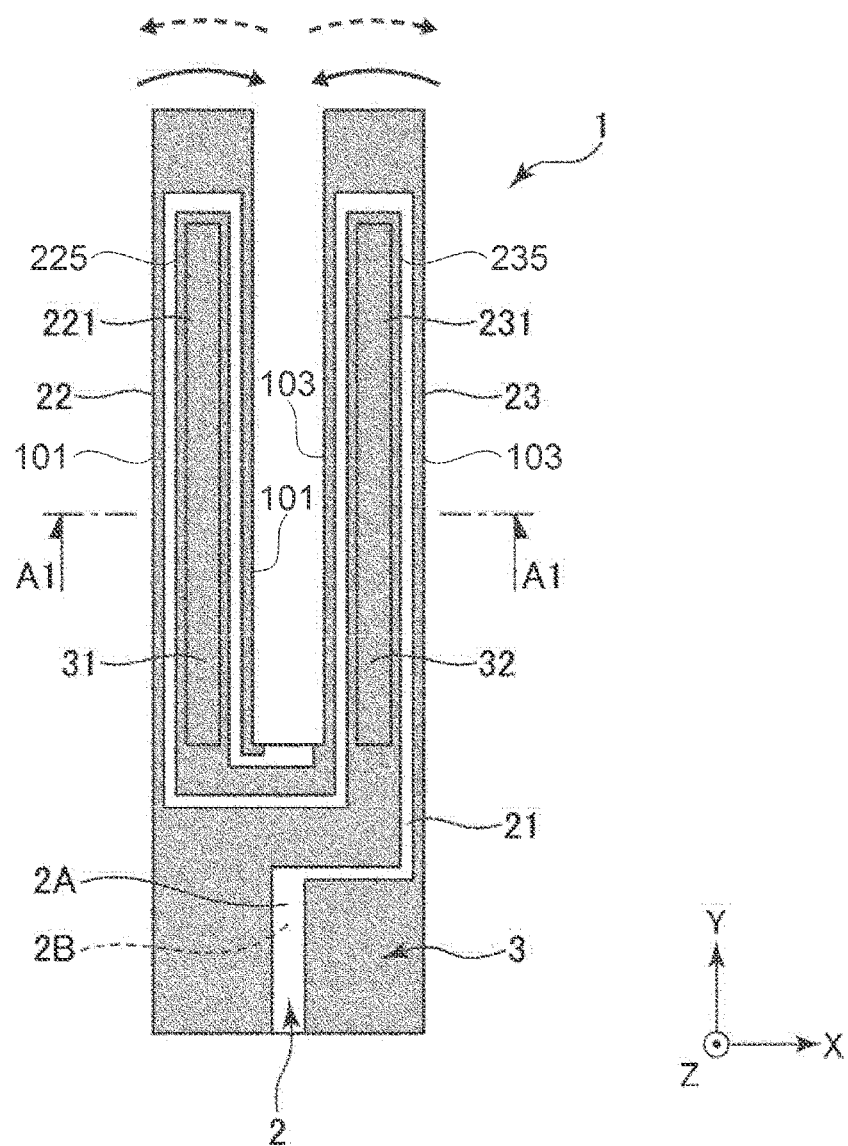
FIG. 1 is a plan view showing a vibration element according to a first embodiment.
Figure 2:
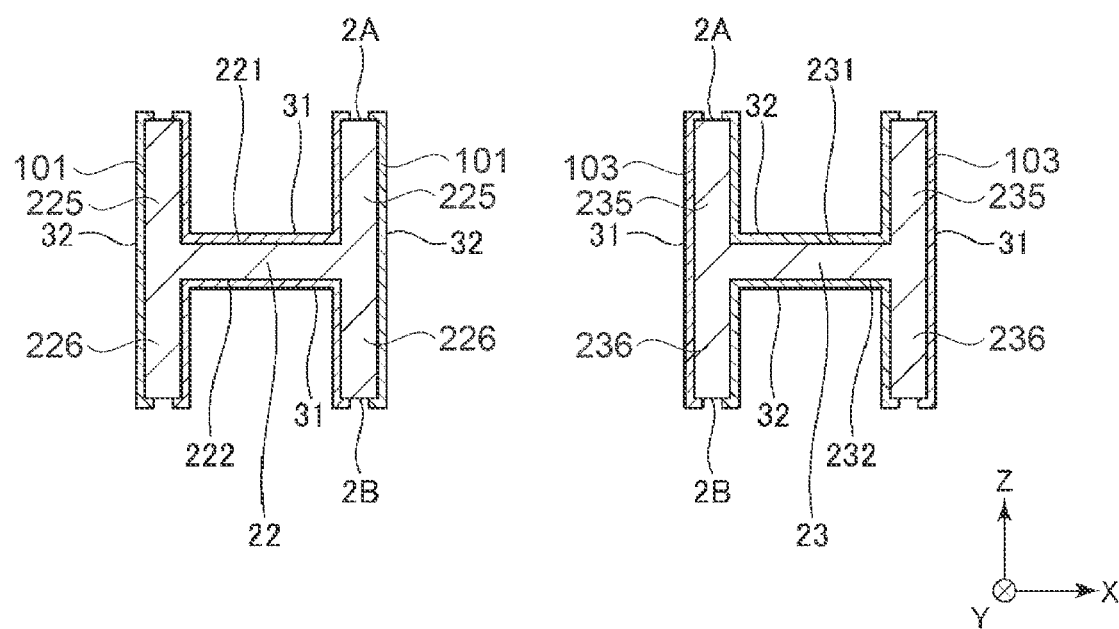
FIG. 2 is a cross-sectional view of the vibration element taken along the line A1-A1 in FIG. 1.

The vibration element 1 is a tuning-fork-type vibration element and includes a vibration substrate 2 and an electrode 3 formed at the front surface of the vibration substrate 2, as shown in FIGS. 1 and 2.

The vibration substrate 2 is formed by patterning a Z-cut quartz crystal substrate as a Z-cut quartz crystal plate into a desired shape, spreads in the plane X-Y defined by the axes X and Y, which are the crystal axes of quartz crystal, and has a thickness along the direction Z. The axis X is also called an electrical axis, the axis Y is also called a mechanical axis, and the axis Z is also called an optical axis. The thickness along the direction Z is also simply called a "thickness".

The vibration substrate 2 has the shape of a plate and has a first surface 2A and a second surface 2B, which are front and rear sides with respect to each other and arranged side by side in the direction Z. The vibration substrate 2 has a base 21, and a first vibrating arm 22 and a second vibrating arm 23 extending from the base 21 along the direction Y and arranged side by side along the direction X.

The first vibrating arm 22 has a bottomed first groove 221, which opens via the first surface 2A, a first bank 225, which defines the first groove 221, a bottomed second groove 222, which opens via the second surface 2B, a second bank 226, which defines the second groove 222, and a side surface 101, which couples the first surface 2A and the second surface 2B to each other. The first bank 225 is a portion of the first surface 2A, the portion sandwiching and disposed alongside the first groove 221 along the direction X in the plan view. The second bank 226 is a portion of the second surface 2B, the portion sandwiching and disposed alongside the second groove 222 along the direction X in the plan view.

Similarly, the second vibrating arm 23 has a bottomed first groove 231, which opens via the first surface 2A, a first bank 235, which defines the first groove 231, a bottomed second groove 232, which opens via the second surface 2B, a second bank 236, which defines the second groove 232, and a side surface 103, which couples the first surface 2A and the second surface 2B to each other. The first bank 235 is a portion of the first surface 2A, the portion sandwiching and disposed alongside the first groove 231 along the direction X in the plan view. The second bank 236 is a portion of the second surface 2B, the portion sandwiching and disposed alongside the second groove 232 along the direction X in the plan view.

The first grooves 221 and 231 and the second grooves 222 and 232 each extend along the direction Y. The first banks 225 and 235 are formed on opposite sides, in the direction X, of the first grooves 221 and 231, respectively, and extend along the direction Y. The second banks 226 and 236 are formed on opposite sides, in the direction X, of the second grooves 222 and 232, respectively, and extend along the direction Y. The first vibrating arm 22 and the second vibrating arm 23 therefore each have a substantially H-shaped cross-sectional shape. The thus configured vibration element 1 has a reduced thermoelastic loss and excellent vibration characteristics.

The electrode 3 includes a signal electrode 31 and a ground electrode 32. The signal electrode 31 is disposed at the first surface 2A and the second surface 2B of the first vibrating arm 22 and the side surface 103 of the second vibrating arm 23. On the other hand, the ground electrode 32 is disposed at the side surface 101 of the first vibrating arm 22 and the first surface 2A and the second surface 2B of the second vibrating arm 23. When a drive signal is applied to the signal electrode 31 with the ground electrode 32 grounded, the first vibrating arm 22 and the second vibrating arm 23 perform flexural vibration in the direction X, in which the two vibrating arms repeatedly approach each other and separate from each other, as indicated by the arrows in FIG. 1.

The vibration element 1 has been briefly described above.

The method for manufacturing the vibration element 1 will next be described. The method for manufacturing the vibration element 1 includes a preparation step S1 of preparing a quartz crystal substrate 20, which is the base material of the vibration substrate 2, a first protective film formation step S2 of forming a first protective film 51 at a first substrate surface 20A of the quartz crystal substrate 20, a first dry etching step S3 of dry-etching the quartz crystal substrate 20 via the first protective film 51 to form the first grooves 221 and 231, a second protective film formation step S4 of forming a second protective film 52 at the first grooves 221 and 231, a second dry etching step S5 of dry-etching the quartz crystal substrate 20 via the second protective film 52, a first protective film removal step S6 of removing the first protective film 51 left at the first substrate surface 20A, a second protective film removal step S7 of removing the second protective film 52 left at the first grooves 221 and 231, a third protective film formation step S8 of forming a third protective film 61 at a second substrate surface 20B of the quartz crystal substrate 20, a third dry etching step S9 of dry-etching the quartz crystal substrate 20 via the third protective film 61 to form the second grooves 222 and 232, a fourth protective film formation step S10 of forming a fourth protective film 62 at the second grooves 222 and 232, a fourth dry etching step S11 of dry-etching the quartz crystal substrate 20 via the fourth protective film 62, a third protective film removal step S12 of removing the third protective film 61 left at the second substrate surface 20B, a fourth protective film removal step S13 of removing the fourth protective film 62 left at the second grooves 222 and 232, and an electrode formation step S14 of forming the electrode 3 at the front surface of the vibration substrate 2 produced by the steps described above, as shown in FIG. 3.

The first protective film removal step S6 corresponds to the "first removal step" in the present disclosure. The third protective film removal step S12 corresponds to the "second removal step" in the present disclosure.

The steps described above will be sequentially described below.

Preparation Step S1

Figure 4:
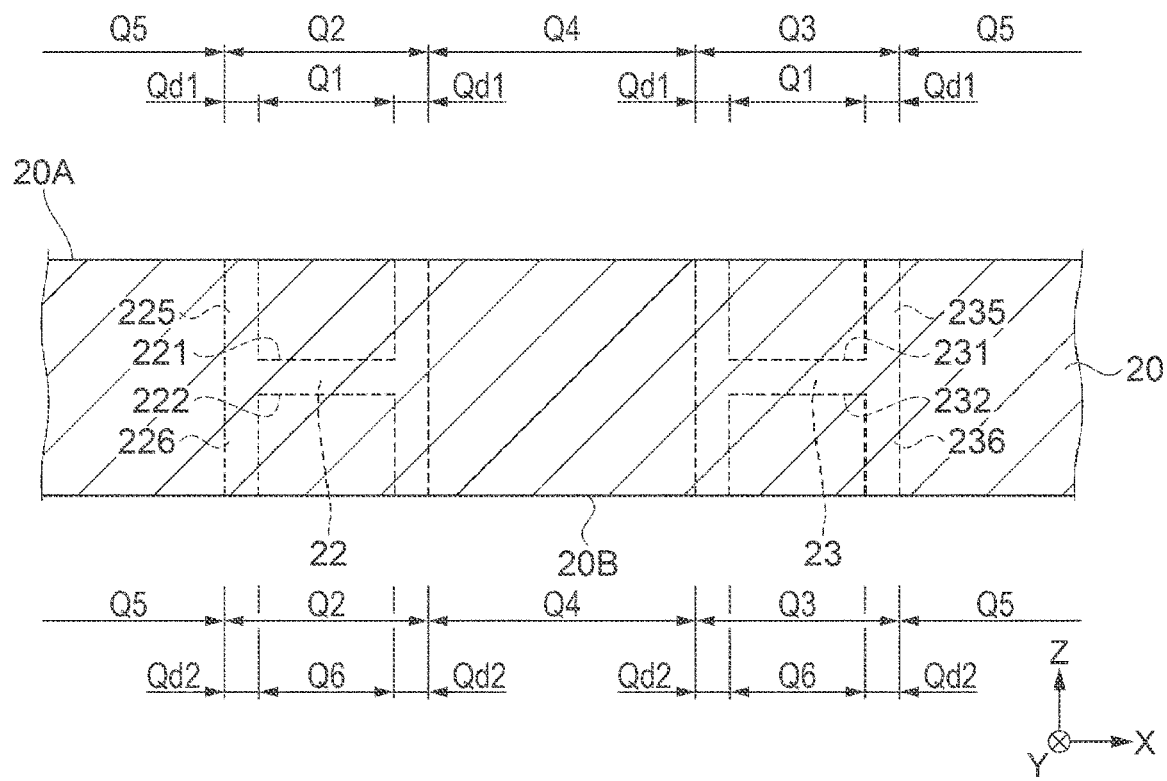
FIG. 4 is a cross-sectional view for describing a method for manufacturing the vibration element.

The quartz crystal substrate 20, which is the base material of the vibration substrate 2, is prepared, as shown in FIG. 4. A plurality of the vibration elements 1 are formed all at once from the quartz crystal substrate 20. The quartz crystal substrate 20 has the shape of a plate and has the first substrate surface 20A and the second substrate surface 20B, which are front and rear sides with respect to each other and arranged side by side in the direction Z. The thickness of the quartz crystal substrate 20 is adjusted to a desired value through a grinding process, such as lapping and polishing, and the first substrate surface 20A and the second substrate surface 20B are sufficiently smoothed. Surface treatment using wet etching may be performed on the quartz crystal substrate 20 as required.

In the following description, the region where the first vibrating arm 22 is formed is also called a first vibrating arm forming region Q2. The region where the second vibrating arm 23 is formed is also called a second vibrating arm forming region Q3. The region located between the first vibrating arm forming region Q2 and the second vibrating arm forming region Q3 is also called an inter-arm region Q4. The region located between adjacent vibration substrates 2 is also called an inter-element region Q5.

The first vibrating arm forming region Q2 and the second vibrating arm forming region Q3 have a first groove forming region Q1, where the first grooves 221 and 231 are formed, and a first bank forming region Qd1, where the first banks 225 and 235 are formed. In other words, the first bank forming region Qd1 corresponds to the area excluding the first groove forming region Q1 from the first vibrating arm forming region Q2 and the second vibrating arm forming region Q3. The first grooves 221 and 231 and the first banks 225 and 235 are formed in the first dry etching step S3, which will be described later.

The first vibrating arm forming region Q2 and the second vibrating arm forming region Q3 further have a second groove forming region Q6, where the second grooves 222 and 232 are formed, and a second bank forming region Qd2, where the second banks 226 and 236 are formed. In other words, the second bank forming region Qd2 corresponds to the region excluding the second groove forming region Q6 from the first vibrating arm forming region Q2 and the second vibrating arm forming region Q3. The second grooves 222 and 232 and the second banks 226 and 236 are formed by the third dry etching step S9, which will be described later.

First Protective Film Formation Step S2

Figure 5:
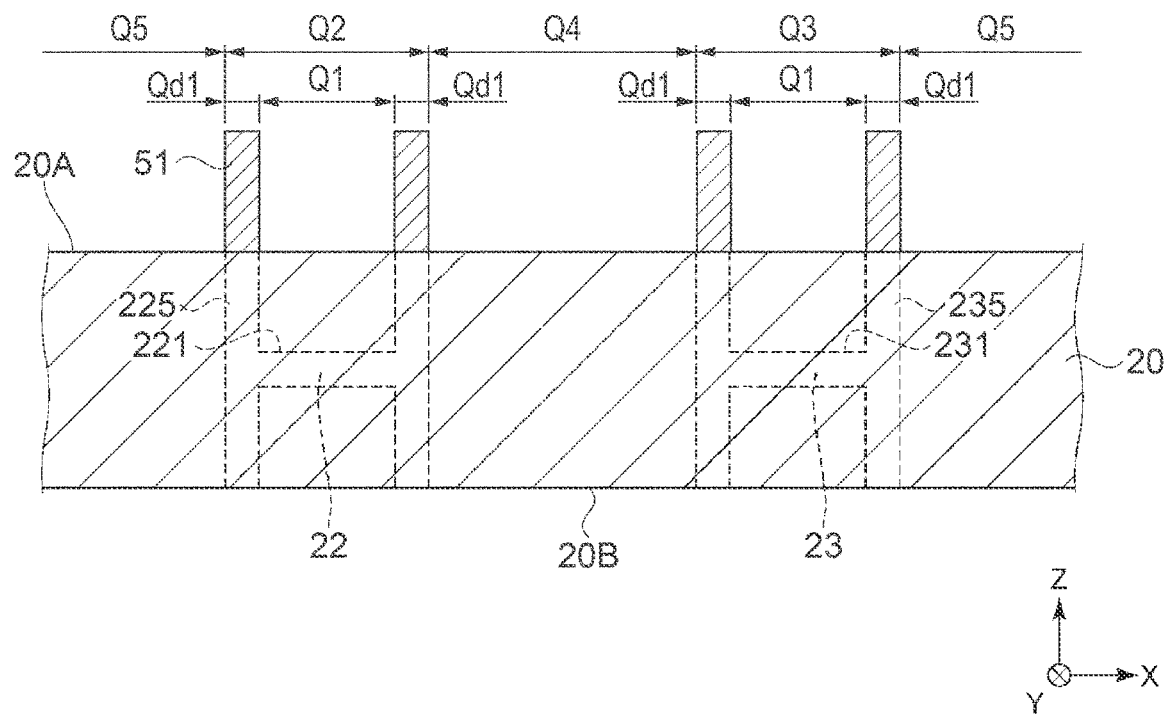
FIG. 5 is a cross-sectional view for describing the method for manufacturing the vibration element.

The first protective film 51 is formed at the first substrate surface 20A of the quartz crystal substrate 20, as shown in FIG. 5. The first protective film 51 is formed at the first bank forming region Qd1 of the first substrate surface 20A.

In the present embodiment, the first protective film 51 is a resin film made of resin. For example, the first protective film 51 can be formed by applying a resist material, which is a photosensitive resin, onto the first substrate surface 20A and patterning the resultant structure by using a lithographic technique. For example, the first protective film 51 can instead be formed by selectively applying the resin by using screen printing, imprinting, or any other printing technique. Since a resin film can be readily formed as described above, the first protective film formation step S2 can be simplified by using a resin film as the first protective film 51.

In the present embodiment, the thus formed first protective film 51 is so thick as to be left in the first bank forming region Qd1 when the first dry etching step S3 and second dry etching step S5, which will be described later, are completed. Note that the first protective film 51 may be so thin as to be removed from the first bank forming region Qd1 when the first dry etching step S3 or the second dry etching step S5 is completed.

In the present embodiment, the first protective film 51 is made of resin and may instead be made of a non-resin material. For example, the first protective film 51 may be a metal film made of metal.

First Dry Etching Step S3

Figure 6:
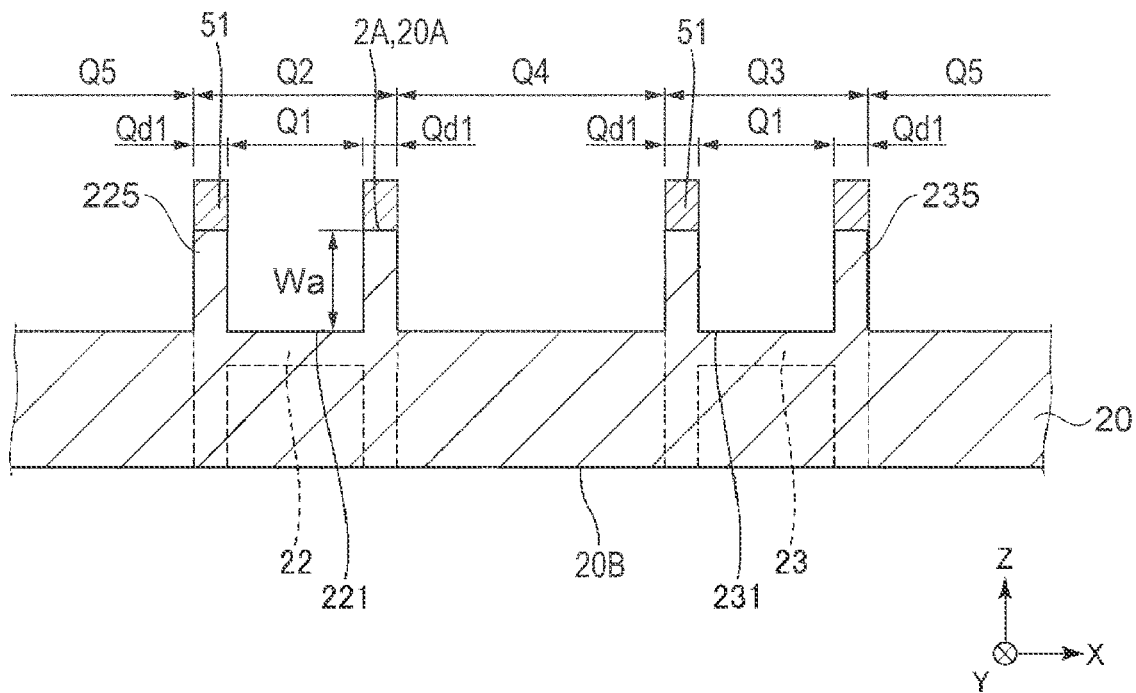
FIG. 6 is a cross-sectional view for describing the method for manufacturing the vibration element.

The quartz crystal substrate 20 is dry-etched from the side facing the first substrate surface 20A via the first protective film 51 to simultaneously form the first grooves 221 and 231 and the outer shape of the vibration substrate 2, as shown in FIG. 6. The phrase "simultaneously form" means that two features are formed all at once in a single step. The present step is reactive ion etching and is executed by using a reactive ion etching apparatus (RIE apparatus). The reaction gas introduced into the RIE apparatus is not limited to a specific gas and may, for example, be $SF_6$, $CF_4$, $C_2F_4$, $C_2F_6$, $C_3F_6$, or $C_4F_8$.

In the present step, the first protective film 51 formed in the first bank forming region Qd1 is used as a mask, and the areas excluding the first bank forming region Qd1 are etched. The areas excluding the first bank forming region Qd1 are the first groove forming region Q1, the inter-arm region Q4, and the inter-element region Q5. The first groove forming region Q1 of the quartz crystal substrate 20 is etched from the side facing the first substrate surface 20A to form the first grooves 221 and 231. The etching depth in the first groove forming region Q1 corresponds to the depth of the first grooves 221 and 231. The inter-arm region Q4 and the inter-element region Q5 of the quartz crystal substrate 20 are etched from the side facing the first substrate surface 20A to form the outer shape of the vibration substrate 2. The etching depth in the inter-arm region Q4 and inter-element region Q5 corresponds to a depth of the outer shape of the vibration substrate 2. The "outer shape of the vibration substrate 2" is also called the "outer shapes of the first vibrating arm 22 and the second vibrating arm 23".

The first dry etching step S3 ends when the depth of the first grooves 221 and 231 reaches a desired depth Wa. In the present embodiment, the depth of the outer shape of the vibration substrate 2 at the end of the present step is approximately equal to the depth Wa of the first grooves 221 and 231. The term "approximately equal" conceptually includes a case where the two depths are not equal to each other in an exact sense due, for example, to variation in the etching conditions.

In the present embodiment, the first protective film 51 is formed in the first bank forming region Qd1 of the first substrate surface 20A but is not formed in the first groove forming region Q1, the inter-arm region Q4, or the inter-element region Q5, as described above. That is, the first groove forming region Q1, the inter-arm region Q4, and the inter-element region Q5 of the first substrate surface 20A are exposed. Therefore, in the first dry etching step S3, etching of the first groove forming region Q1, the inter-arm region Q4, and the inter-element region Q5 starts as the dry etching starts. The first dry etching step S3 can therefore be executed in a short period.

Second Protective Film Formation Step S4

Figure 7:
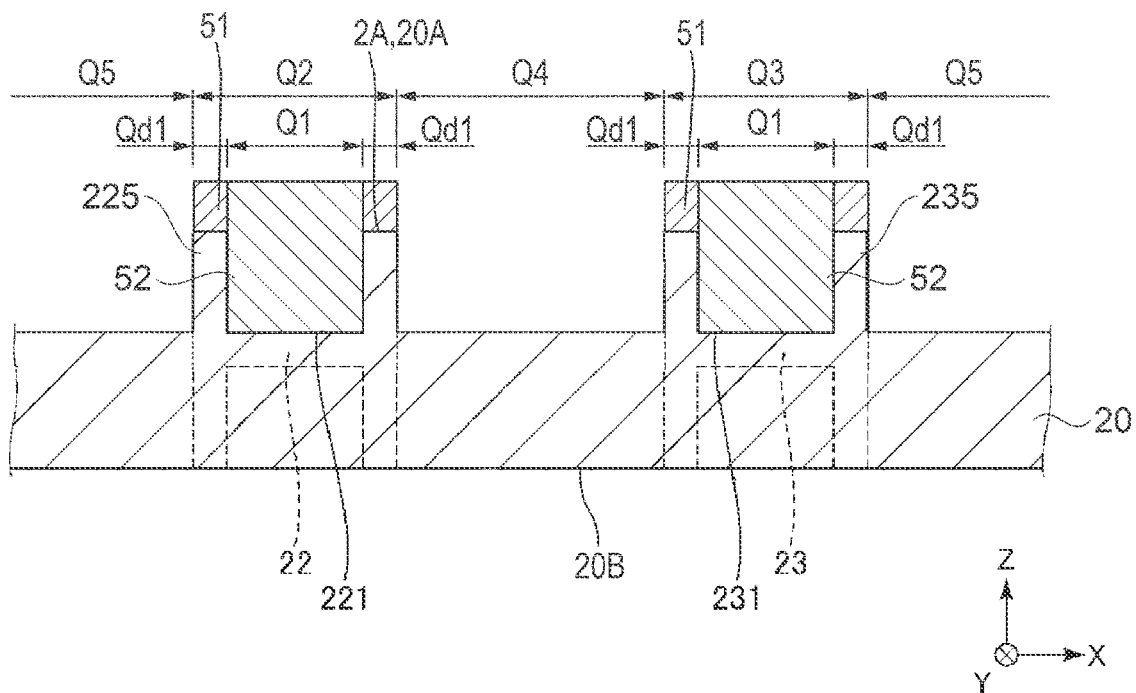
FIG. 7 is a cross-sectional view for describing the method for manufacturing the vibration element.

The second protective film 52 is formed in the first grooves 221 and 231, as shown in FIG. 7.

In the present embodiment, the second protective film 52 is a resin film made of resin. The second protective film 52 is formed by burying the resin in the first grooves 221 and 231. For example, the second protective film 52 can be formed by applying a resist material, which is a photosensitive resin, onto the quartz crystal substrate 20 from the side facing the first substrate surface 20A and patterning the resultant structure by using a lithographic technique. For example, the second protective film 52 can instead be formed by selectively applying the resin by using screen printing, imprinting, or any other printing technique. Since a resin film can be readily formed as described above, the second protective film formation step S4 can be simplified by using a resin film as the second protective film 52.

In the present embodiment, the thus formed second protective film 52 is thicker than or equal to the depth Wa of the first grooves 221 and 231 when the second dry etching step S5, which will be described later, is completed. Note that the formed second protective film 52 only needs to be so thick as to be left at the bottom surfaces of the first grooves 221 and 231 when the second dry etching step S5 is completed.

In the present embodiment, the second protective film 52 is a thick film formed by burying the resin in the first grooves 221 and 231, and may instead be a thin film that covers the sidewalls and the bottom surfaces of the first grooves 221 and 231.

In the present embodiment, the second protective film 52 is made of resin, and may instead be made of a non-resin material. For example, the second protective film 52 may be a metal film made of metal.

Second Dry Etching Step S5

Figure 8:
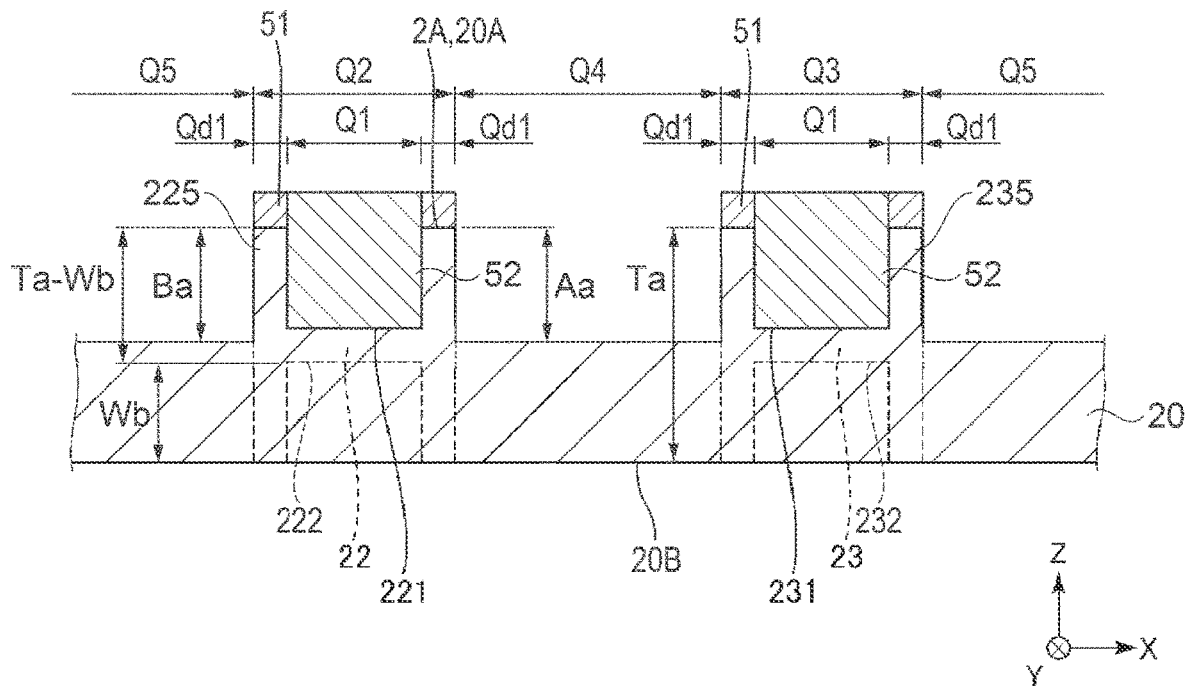
FIG. 8 is a cross-sectional view for describing the method for manufacturing the vibration element.

The quartz crystal substrate 20 is dry-etched from the side facing the first substrate surface 20A via the second protective film 52 to simultaneously form the first surface 2A of the first vibrating arm 22 and the second vibrating arm 23, and the outer shape of the vibration substrate 2, as shown in FIG. 8. The present step is reactive ion etching and is executed by using an RIE apparatus.

In the present step, the second protective film 52 formed in the first groove forming region Q1 is used as a mask, and the areas excluding the first groove forming region Q1 are etched. Note in the present embodiment that the first protective film 51 has been left in the first bank forming region Qd1, as described above. Therefore, in the present step, the first protective film 51 and the second protective film 52 are used as a mask, and the areas excluding the first groove forming region Q1 and the first bank forming region Qd1 of the quartz crystal substrate 20 are etched. The areas excluding the first groove forming region Q1 and the first bank forming region Qd1 are the inter-arm region Q4 and the inter-element region Q5.

The inter-arm region Q4 and the inter-element region Q5 of the quartz crystal substrate 20 are thus etched from the side facing the first substrate surface 20A to form the outer shape of the vibration substrate 2.

The second dry etching step S5 ends when depths of the outer shape of the vibration substrate 2 reach desired depths Aa and Ba. That is, at the end of the present step, the etching depth in the inter-arm region Q4 is the depth Aa, and the etching depth in the inter-element region Q5 is the depth Ba. In the present embodiment, the depth Aa and the depth Ba are approximately equal to each other.

In the present embodiment, at the end of the present step, the depths Aa and Ba of the outer shape of the vibration substrate 2 are greater than or equal to half a thickness Ta of the quartz crystal substrate 20.

In the present embodiment, the depths Aa and Ba of the outer shape of the vibration substrate 2 are smaller than Ta−Wb, which is the difference between the thickness Ta of the quartz crystal substrate 20 and a depth Wb of the second grooves 222 and 232 formed in the third dry etching step S9, which will be described later. $Aa<Ta-Wb$ and $Ba<Ta-Wb$ are satisfied.

In the present embodiment, in the second dry etching step S5, the dry etching is terminated with the first protective film 51 left at the first substrate surface 20A of the quartz crystal substrate 20. That is, the first bank forming region Qd1 of the first substrate surface 20A is protected by the first protective film 51 and has therefore not been etched in the first dry etching step S3 or the second dry etching step S5. The first bank forming region Qd1 of the first substrate surface 20A forms the first surface 2A of the first vibrating arm 22 and the second vibrating arm 23 in the first protective film removal step S6, which will be described later.

In the second dry etching step S5, the dry etching may be terminated with no first protective film 51 left at the first substrate surface 20A. That is, the first bank forming region Qd1 may be etched. In this case, the surface etched in the second dry etching step S5 forms the first surface 2A of the first vibrating arm 22 and the second vibrating arm 23.

Etching part of the first bank forming region Qd1 of the first substrate surface 20A and not etching another part thereof as described above form the first surface 2A of the first vibrating arm 22 and the second vibrating arm 23.

The first protective film formation step S2, the first dry etching step S3, the second protective film formation step S4, and the second dry etching step S5 are summarized below.

Dry etching can process quartz crystal without affecting the crystal planes thereof, allowing formation of the first grooves 221 and 231 and the outer shapes of the first vibrating arm 22 and the second vibrating arm 23 with excellent dimensional accuracy.

Forming the first grooves 221 and 231 and the outer shape of the vibration substrate 2 all at once allows reduction in the number of steps of manufacturing the vibration element 1 and the cost thereof. Furthermore, positional shift of the first grooves 221 and 231 from the outer shape does not occur, whereby the vibration substrate 2 can be formed with increased accuracy.

Since the first grooves 221 and 231 and the outer shapes of the first vibrating arm 22 and the second vibrating arm 23 can be formed without using the micro-loading effect, the width of the inter-arm region Q4, the width of the inter-element region Q5, the widths of the first grooves 221 and 231, and other dimensions can be set without any restrictions, whereby the degree of design flexibility of the vibration element 1 can be improved. For example, adjusting the thickness and width of the first protective film 51 in the first protective film formation step S2 allows control of the dimensions of the first grooves 221 and 231 and the outer shapes of the first vibrating arm 22 and the second vibrating arm 23.

Since the micro-loading effect is not used, restrictions on the dry etching conditions, such as selection of the reaction gas used to perform the dry etching, are relaxed, whereby the vibration element 1 can be more readily manufactured than when the micro-loading effect is used.

First Protective Film Removal Step S6

Figure 9:
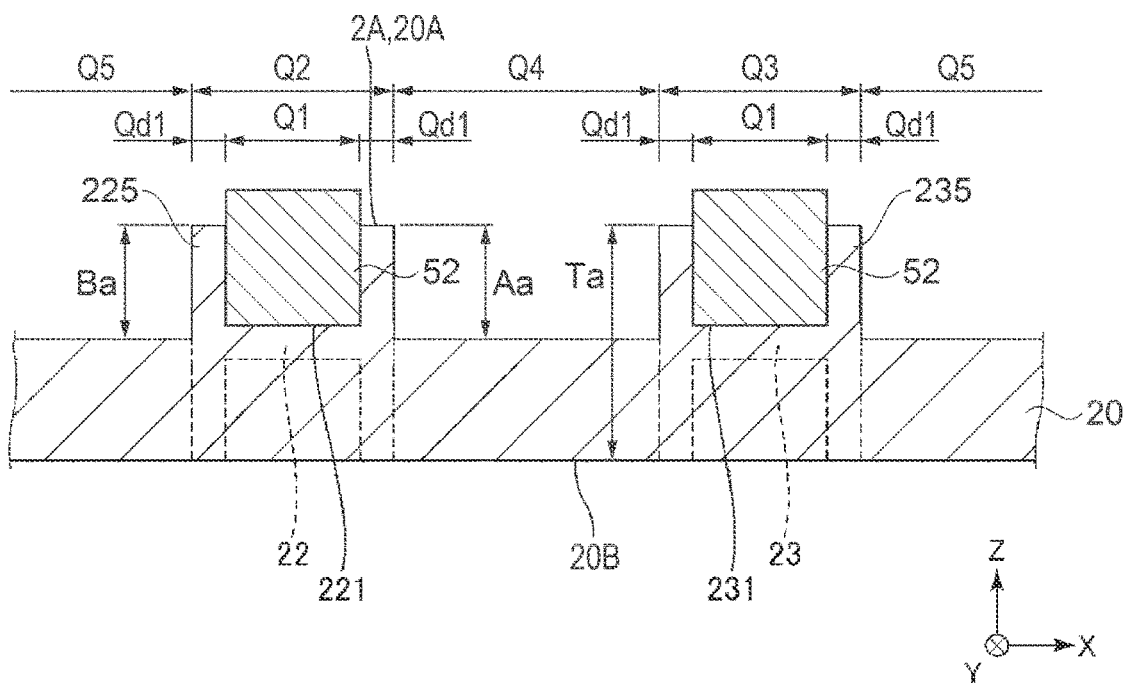
FIG. 9 is a cross-sectional view for describing the method for manufacturing the vibration element.

The first protective film 51 left at the first substrate surface 20A of the quartz crystal substrate 20 is removed, as shown in FIG. 9. The first substrate surface 20A thus forms the first surface 2A of the first vibrating arm 22 and the second vibrating arm 23. Since the first surface 2A of the first vibrating arm 22 and the second vibrating arm 23 has not been etched in the first dry etching step S3 or the second dry etching step S5, the thickness of the first vibrating arm 22 and the second vibrating arm 23 and the surface roughness of the first surface 2A are maintained equal to the thickness of the quartz crystal substrate 20 and the surface roughness of the first substrate surface 20A. The accuracy of the thickness of the first vibrating arm 22 and the second vibrating arm 23 is therefore improved, whereby occurrence of unwanted vibration such as torsional vibration is suppressed.

In a case where the first protective film 51 is removed from the first substrate surface 20A and is not left there when the second dry etching step S5 is completed, the first protective film removal step S6 may not be provided.

Second Protective Film Removal Step S7

Figure 10:
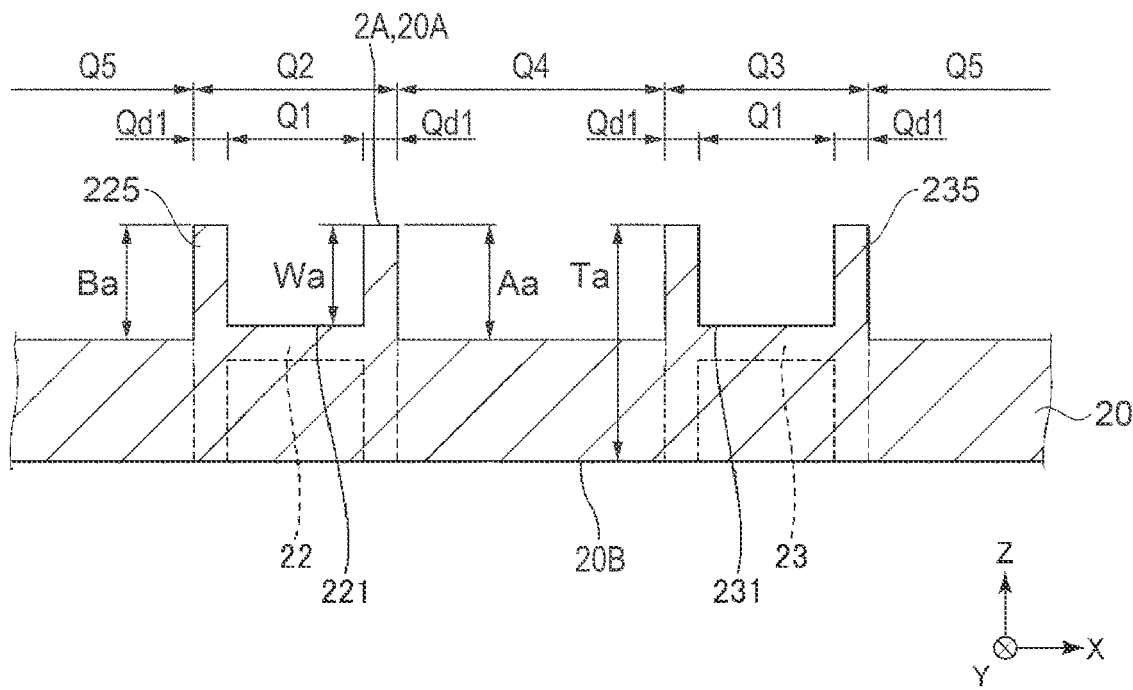
FIG. 10 is a cross-sectional view for describing the method for manufacturing the vibration element.

The second protective film 52 left in the first grooves 221 and 231 is removed, as shown in FIG. 10.

The order in accordance with which the first protective film removal step S6 and the second protective film removal step S7 are executed is not limited to the order described above, and the order of execution may be reversed. Furthermore, the first protective film removal step S6 and the second protective film removal step S7 may be executed as a single step to remove the first protective film 51 and the second protective film 52 all at once.

Completion of the second protective film removal step S7 is followed by processing of the second substrate surface 20B of the quartz crystal substrate 20.

Third Protective Film Formation Step S8

The present step is executed as the first protective film formation step S2 is.

Figure 11:
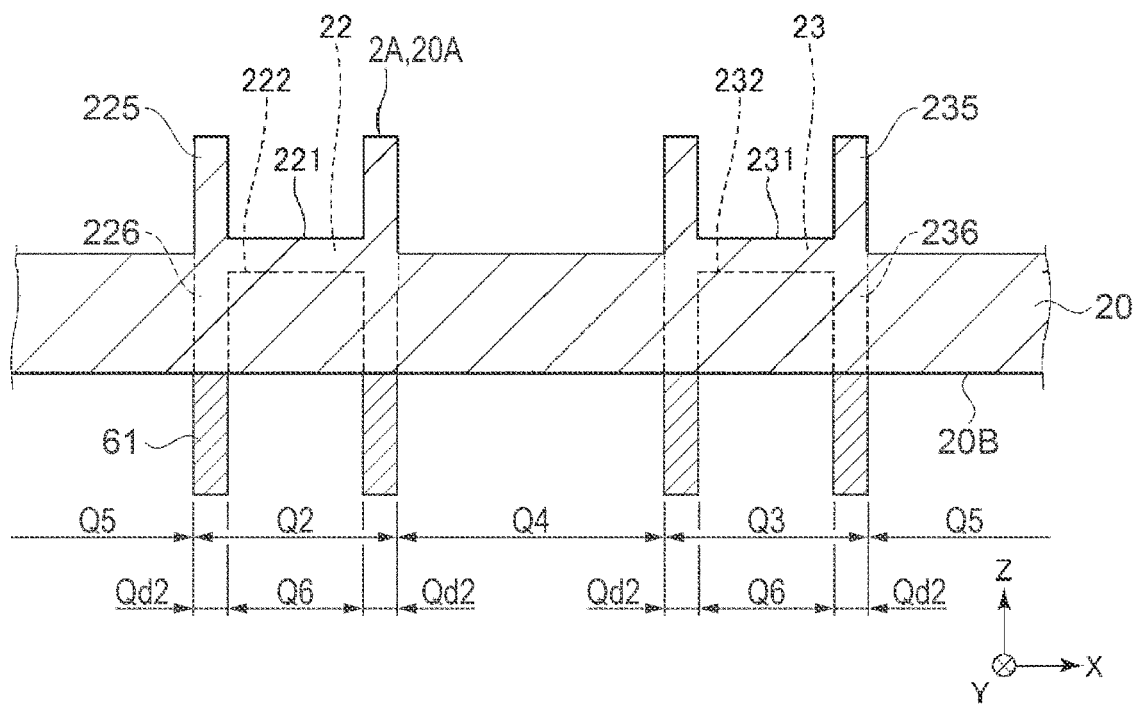
FIG. 11 is a cross-sectional view for describing the method for manufacturing the vibration element.

The third protective film 61 is formed at the second substrate surface 20B of the quartz crystal substrate 20, as shown in FIG. 11. The third protective film 61 is formed in the second bank forming region Qd2 of the second substrate surface 20B.

In the present embodiment, the third protective film 61 is a resin film made of resin. The configuration in which the third protective film 61 is formed of a resin film can simplify the third protective film formation step S8.

In the present embodiment, the thus formed third protective film 61 is so thick as to be left in the second bank forming region Qd2 when the third dry etching step S9 and fourth dry etching step S11, which will be described later, are completed. Note that the formed third protective film 61 may be so thin as to be removed from the second bank forming region Qd2 when the third dry etching step S9 or the fourth dry etching step S11 is completed.

In the present embodiment, the third protective film 61 is made of resin and may instead be made of a non-resin material. For example, the third protective film 61 may be a metal film made of metal.

Third Dry Etching Step S9

The present step is executed as the first dry etching step S3 is.

Figure 12:
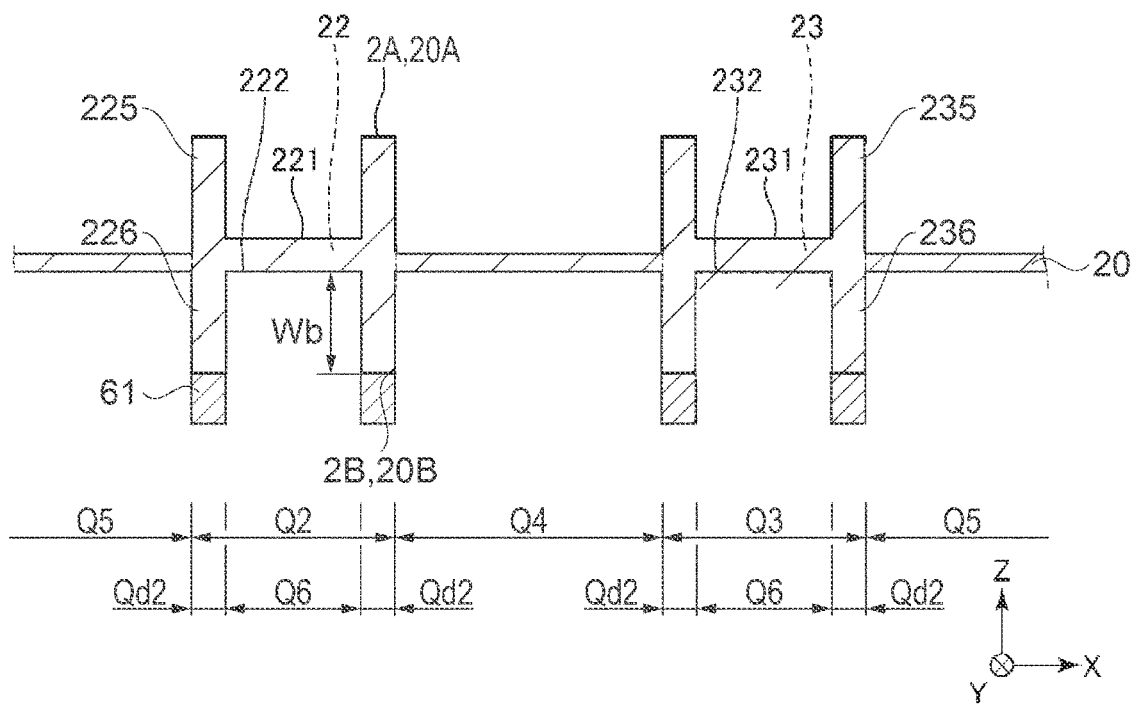
FIG. 12 is a cross-sectional view for describing the method for manufacturing the vibration element.

The quartz crystal substrate 20 is dry-etched from the side facing the second substrate surface 20B via the third protective film 61 to simultaneously form the second grooves 222 and 232 and the outer shape of the vibration substrate 2, as shown in FIG. 12.

In the present step, the third protective film 61 formed in the second bank forming region Qd2 is used as a mask, and the quartz crystal substrate 20, specifically, the second groove forming region Q6, the inter-arm region Q4, and the inter-element region Q5 are etched. The second groove forming region Q6 of the quartz crystal substrate 20 is etched from the side facing the second substrate surface 20B to form the second grooves 222 and 232. The etching depth in the second groove forming region Q6 corresponds to the depth of the second grooves 222 and 232. The inter-arm region Q4 and the inter-element region Q5 of the quartz crystal substrate 20 are etched from the side facing the second substrate surface 20B to form the outer shape of the vibration substrate 2.

The third dry etching step S9 ends when the depth of the second grooves 222 and 232 reaches the desired depth Wb. In the present embodiment, the depth of the outer shape of the vibration substrate 2 at the end of the present step is approximately equal to the depth Wb of the second grooves 222 and 232.

In the present embodiment, the third protective film 61 is formed in the second bank forming region Qd2 of the second substrate surface 20B but is not formed in the second groove forming region Q6, the inter-arm region Q4, or the inter-element region Q5, as described above. That is, the second groove forming region Q6, the inter-arm region Q4, and the inter-element region Q5 of the second substrate surface 20B are exposed. Therefore, in the third dry etching step S9, etching of the second groove forming region Q6, the inter-arm region Q4, and the inter-element region Q5 starts as the dry etching starts. The third dry etching step S9 can therefore be executed in a short period.

Fourth Protective Film Formation Step S10

The present step is executed as the second protective film formation step S4 is.

Figure 13:
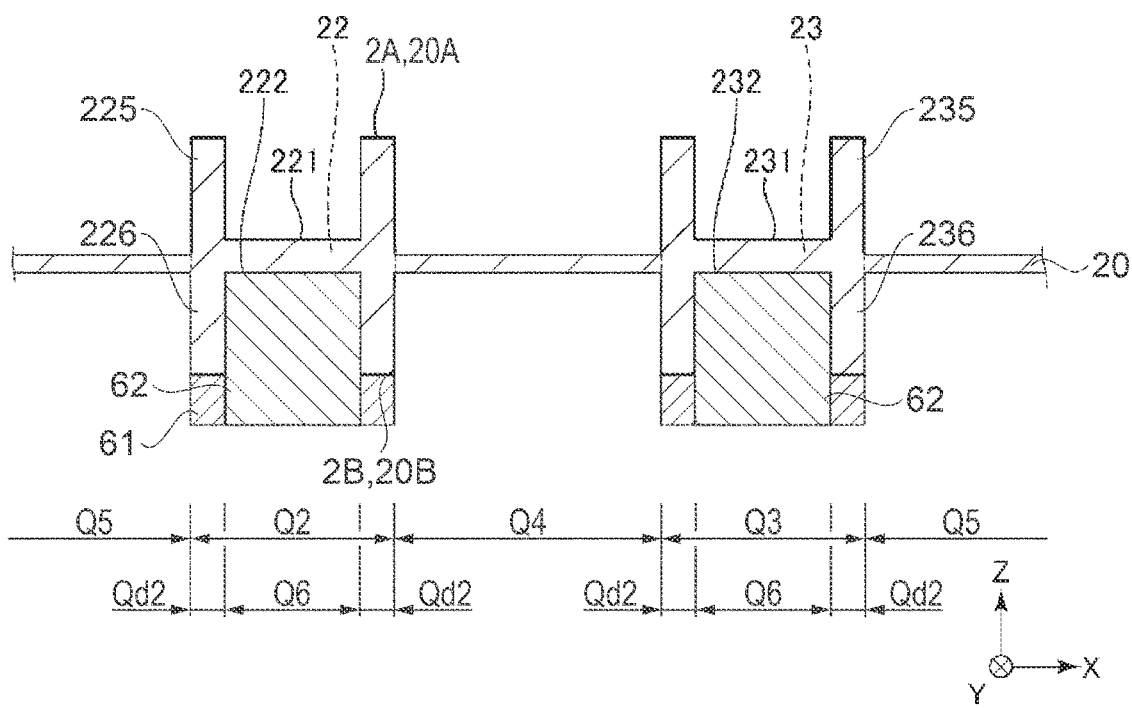
FIG. 13 is a cross-sectional view for describing the method for manufacturing the vibration element.

The fourth protective film 62 is formed in the second grooves 222 and 232, as shown in FIG. 13.

In the present embodiment, the fourth protective film 62 is a resin film made of resin. The fourth protective film 62 is formed by burying the resin in the second grooves 222 and 232. The configuration in which the fourth protective film 62 is formed of a resin film can simplify the fourth protective film formation step S10.

In the present embodiment, the thus formed fourth protective film 62 is thicker than or equal to the depth Wb of the second grooves 222 and 232 when the fourth dry etching step S11, which will be described later, is completed. Note that the formed fourth protective film 62 only needs to be so thick as to be left at the bottom surfaces of the second grooves 222 and 232 when the fourth dry etching step S11 is completed.

In the present embodiment, the fourth protective film 62 is a thick film formed by burying the resin in the second grooves 222 and 232, and may instead be a thin film that covers the sidewalls and the bottom surfaces of the second grooves 222 and 232.

In the present embodiment, the fourth protective film 62 is made of resin and may instead be made of a non-resin material. For example, the fourth protective film 62 may be a metal film made of metal.

Fourth Dry Etching Step S11

The present step is executed as the second dry etching step S5 is.

Figure 14:
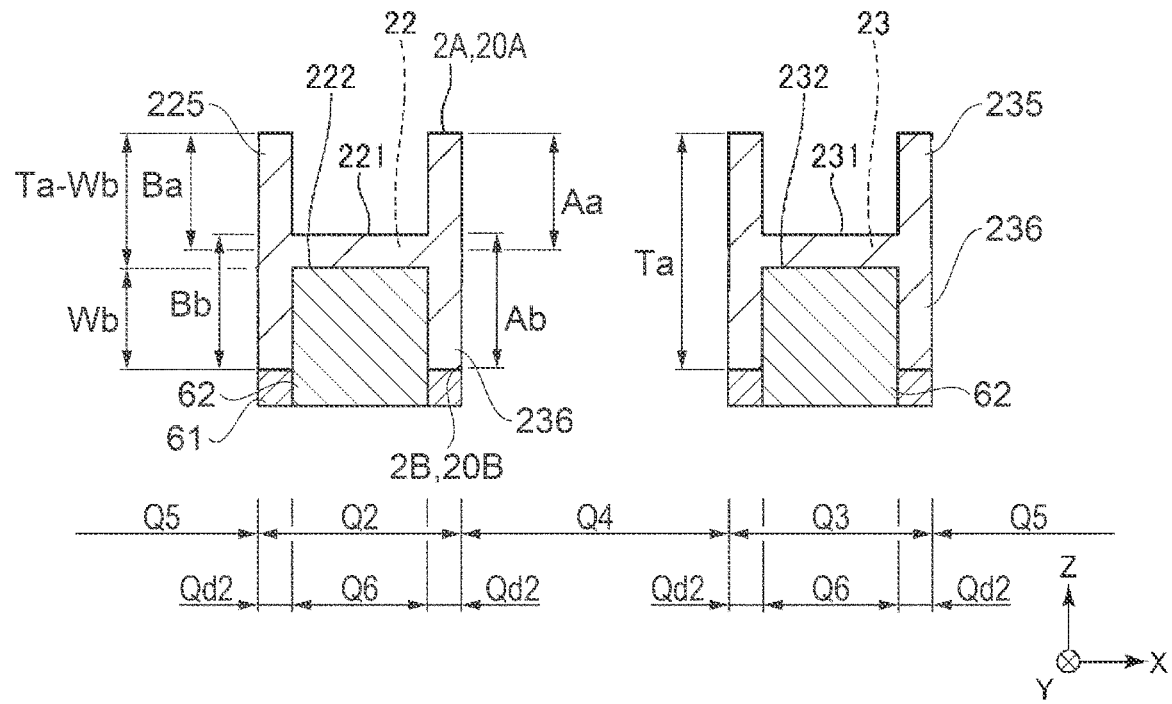
FIG. 14 is a cross-sectional view for describing the method for manufacturing the vibration element.

The quartz crystal substrate 20 is dry-etched from the side facing the second substrate surface 20B via the fourth protective film 62 to simultaneously form the second surface 2B of the first vibrating arm 22 and the second vibrating arm 23, and the outer shape of the vibration substrate 2, as shown in FIG. 14.

In the present step, the fourth protective film 62 formed in the second groove forming region Q6 is used as a mask, and the areas excluding the second groove forming region Q6 are etched. Note in the present embodiment that the third protective film 61 has been left in the second bank forming region Qd2, as described above. Therefore, in the present step, the third protective film 61 and the fourth protective film 62 are used as a mask, and the inter-arm region Q4 and the inter-element region Q5 of the quartz crystal substrate 20 are etched.

The inter-arm region Q4 and the inter-element region Q5 of the quartz crystal substrate 20 are thus etched from the side facing the second substrate surface 20B to form the outer shape of the vibration substrate 2.

The fourth dry etching step S11 ends when depths of the outer shape of the vibration substrate 2 reach desired depths Ab and Bb. That is, at the end of the present step, the etching depth in the inter-arm region Q4 is the depth Ab, and the etching depth in the inter-element region Q5 is the depth Bb. In the present embodiment, the depth Ab and the depth Bb are approximately equal to each other.

In the present embodiment, at the end of the present step, the depths Ab and Bb of the outer shape of the vibration substrate 2 are greater than or equal to half the thickness Ta of the quartz crystal substrate 20. When the depths Aa and Ba and the depths Ab and Bb are set at values greater than or equal to half the thickness Ta of the quartz crystal substrate 20, the inter-arm region Q4 and the inter-element region Q5 pass through the quartz crystal substrate 20 in the fourth dry etching step S11. The inter-arm region Q4 and the inter-element region Q5 passing through the quartz crystal substrate 20 form the first vibrating arm 22 and the second vibrating arm 23.

In the present embodiment, in the fourth dry etching step S11, the dry etching is terminated with the third protective film 61 left at the second substrate surface 20B of the quartz crystal substrate 20. That is, the second bank forming region Qd2 of the second substrate surface 20B is protected by the third protective film 61 and has therefore not been etched in the third dry etching step S9 or the fourth dry etching step S11. The second bank forming region Qd2 of the second substrate surface 20B forms the second surface 2B of the first vibrating arm 22 and the second vibrating arm 23 in the third protective film removal step S12, which will be described later.

In the fourth dry etching step S11, the dry etching may be terminated with no third protective film 61 left at the second substrate surface 20B. In this case, the surface etched in the fourth dry etching step S11 forms the second surface 2B of the first vibrating arm 22 and the second vibrating arm 23.

Etching part of the second bank forming region Qd2 of the second substrate surface 20B and not etching another part thereof as described above form the second surface 2B of the first vibrating arm 22 and the second vibrating arm 23.

The third protective film formation step S8, the third dry etching step S9, the fourth protective film formation step S10, and the fourth dry etching step S11 are summarized below.

Dry etching can process quartz crystal without affecting the crystal planes thereof, allowing formation of the second grooves 222 and 232 and the outer shapes of the first vibrating arm 22 and the second vibrating arm 23 with excellent dimensional accuracy.

Forming the second grooves 222 and 232 and the outer shape of the vibration substrate 2 all at once allows reduction in the number of steps of manufacturing the vibration element 1 and the cost thereof. Furthermore, positional shift of the second grooves 222 and 232 from the outer shape does not occur, whereby the vibration substrate 2 can be formed with increased accuracy.

Since the second grooves 222 and 232 and the outer shapes of the first vibrating arm 22 and the second vibrating arm 23 can be formed without using the micro-loading effect, the width of the inter-arm region Q4, the width of the inter-element region Q5, the widths of the second grooves 222 and 232, and other dimensions can be set without any restrictions, whereby the degree of design flexibility of the vibration element 1 can be improved. For example, adjusting the thickness and width of the third protective film 61 in the third protective film formation step S8 allows control of the dimensions of the second grooves 222 and 232 and the outer shapes of the first vibrating arm 22 and the second vibrating arm 23.

Since the micro-loading effect is not used, restrictions on the dry etching conditions, such as selection of the reaction gas used to perform the dry etching, are relaxed, whereby the vibration element 1 can be more readily manufactured than when the micro-loading effect is used.

Third Protective Film Removal Step S12

The present step is executed as the first protective film removal step S6 is.

Figure 15:
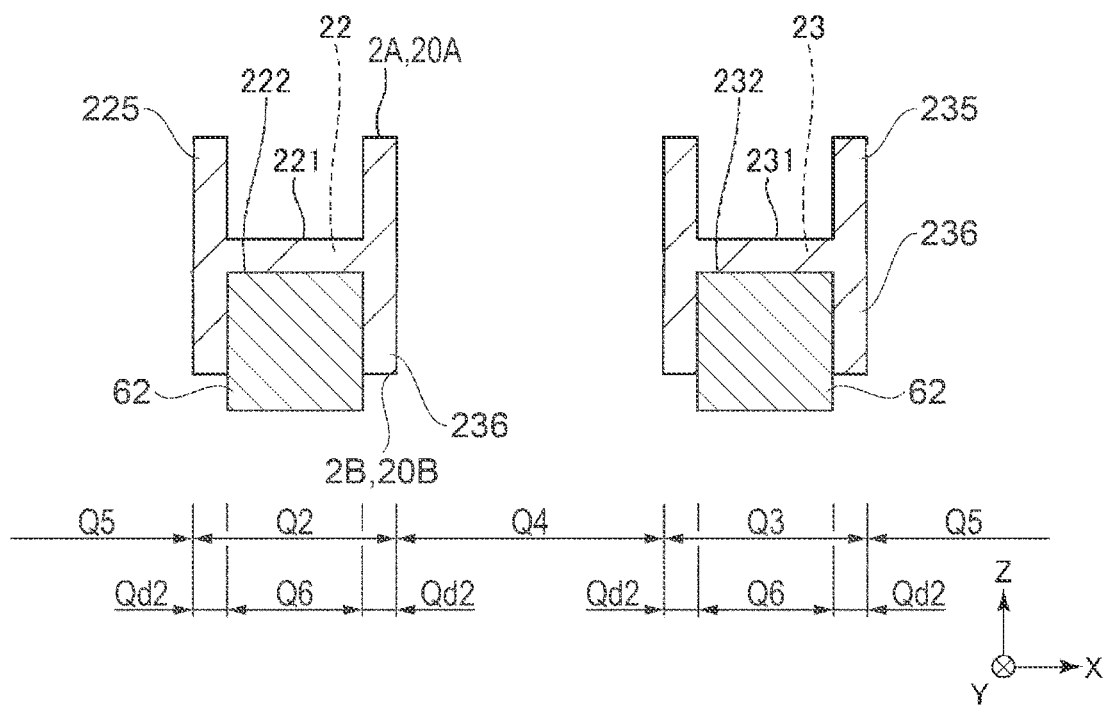
FIG. 15 is a cross-sectional view for describing the method for manufacturing the vibration element.

The third protective film 61 left at the second substrate surface 20B of the quartz crystal substrate 20 is removed, as shown in FIG. 15. The second substrate surface 20B thus forms the second surface 2B of the first vibrating arm 22 and the second vibrating arm 23. Since the second surface 2B of the first vibrating arm 22 and the second vibrating arm 23 is not etched in the third dry etching step S9 or the fourth dry etching step S11, the thickness of the first vibrating arm 22 and the second vibrating arm 23 and the surface roughness of the second surface 2B are maintained equal to the thickness of the quartz crystal substrate 20 and the surface roughness of the second substrate surface 20B. The accuracy of the thickness of the first vibrating arm 22 and the second vibrating arm 23 is therefore improved, whereby occurrence of unwanted vibration such as torsional vibration is suppressed.

In a case where the third protective film 61 is removed from the second substrate surface 20B and is not left there when the fourth dry etching step S11 is completed, the third protective film removal step S12 may not be provided.

Fourth Protective Film Removal Step S13

The present step is executed as the second protective film removal step S7 is.

Figure 16:
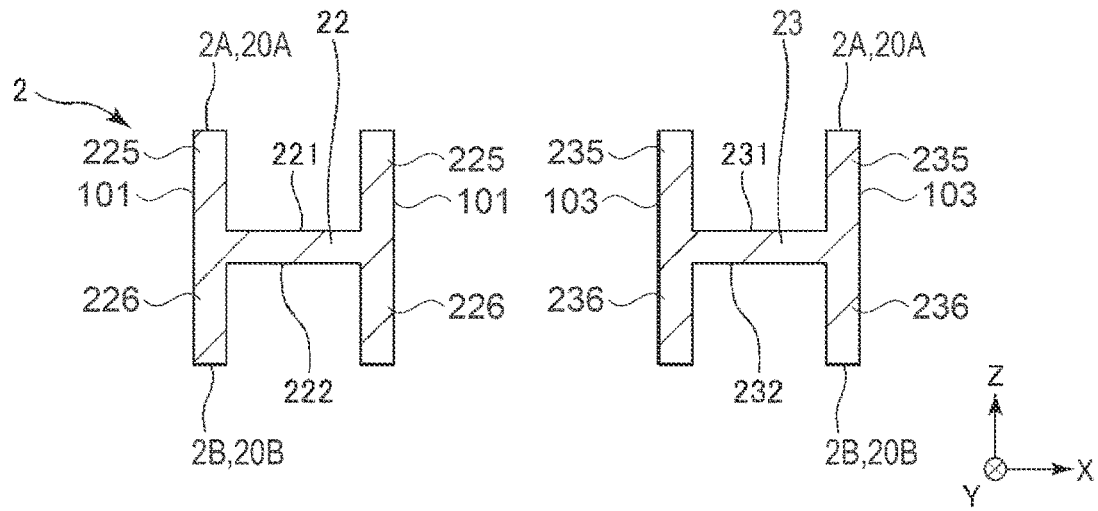
FIG. 16 is a cross-sectional view for describing the method for manufacturing the vibration element.

The fourth protective film 62 left at the second grooves 222 and 232 is removed, as shown in FIG. 16.

The order in accordance with which the third protective film removal step S12 and the fourth protective film removal step S13 are executed is not limited to the order described above, and the order of execution may be reversed. Instead, the third protective film removal step S12 and the fourth protective film removal step S13 may be executed as a single step to remove the third protective film 61 and the fourth protective film 62 all at once.

Still instead, the first protective film removal step S6 may not be provided, but the first protective film 51 and the third protective film 61 may be removed all at once in the third protective film removal step S12. The second protective film removal step S7 may not be provided, but the second protective film 52 and the fourth protective film 62 may be removed all at once in the fourth protective film removal step S13. None of the first protective film removal step S6, the second protective film removal step S7, and the third protective film removal step S12 may be provided, but the first protective film 51, the second protective film 52, the third protective film 61, and the fourth protective film 62 may be removed all at once in the fourth protective film removal step S13.

A plurality of the vibration substrates 2 are collectively formed from the quartz crystal substrate 20 by executing steps S1 to S13 described above, as shown in FIG. 16.

Electrode Formation Step S14

A metal film is deposited at the front surface of the vibration substrate 2, and the metal film is patterned to form the electrode 3.

The vibration element 1 is thus manufactured.

The present embodiment can provide the effects below, as described above.

The method for manufacturing the vibration element 1 is a method for manufacturing the vibration element 1, which includes the first vibrating arm 22 and the second vibrating arm 23, which extend along the direction Y, which is the first direction, and are arranged along the direction X, which is the second direction that intersects with the direction Y, the first vibrating arm 22 and the second vibrating arm 23 having the first surface 2A and the second surface 2B, which are front and rear sides with respect to each other and are arranged in the direction Z, which is the third direction that intersects with the directions X and Y, the first vibrating arm 22 and the second vibrating arm 23 further having the bottomed first grooves 221 and 231, which open via the first surface 2A, and the bottomed second grooves 222 and 232, which open via the second surface 2B, the method including the preparation step S1 of preparing the quartz crystal substrate 20 having the first substrate surface 20A and the second substrate surface 20B, which are front and rear sides with respect to each other, the first protective film formation step S2 of forming the first protective film 51 at the first substrate surface 20A in the first bank forming region Qd1, which is the region excluding the first groove forming region Q1, where the first grooves 221 and 231 are formed, from the first vibrating arm forming region Q2, where the first vibrating arm 22 is formed, and the second vibrating arm forming region Q3, where the second vibrating arm 23 is formed, the first dry etching step S3 of dry-etching the quartz crystal substrate 20 from the side facing the first substrate surface 20A via the first protective film 51 to form the first grooves 221 and 231 and the outer shapes of the first vibrating arm 22 and the second vibrating arm 23, the second protective film formation step S4 of forming the second protective film 52 in the first grooves 221 and 231, the second dry etching step S5 of dry-etching the quartz crystal substrate 20 from the side facing the first substrate surface 20A via the second protective film 52 to form the first surface 2A and the outer shapes of the first vibrating arm 22 and the second vibrating arm 23, the third protective film formation step S8 of forming the third protective film 61 at the second substrate surface 20B in the second bank forming region Qd2, which is the region excluding the second groove forming region Q6, where the second grooves 222 and 232 are formed, from the first vibrating arm forming region Q2 and the second vibrating arm forming region Q3, the third dry etching step S9 of dry-etching the quartz crystal substrate 20 from the side facing the second substrate surface 20B via the third protective film 61 to form the second grooves 222 and 232 and the outer shapes of the first vibrating arm 22 and the second vibrating arm 23, the fourth protective film formation step S10 of forming the fourth protective film 62 in the second grooves 222 and 232, and the fourth dry etching step S11 of dry-etching the quartz crystal substrate 20 from the side facing the second substrate surface 20B via the fourth protective film 62 to form the second surface 2B and the outer shapes of the first vibrating arm 22 and the second vibrating arm 23.

Therefore, the outer shapes of the first vibrating arm 22 and the second vibrating arm 23, the first grooves 221 and 231, and the second grooves 222 and 232 can be formed all at once, and the width of the inter-arm region Q4, the width of the inter-element region Q5, the widths of the first grooves 221 and 231, the widths of the second grooves 222 and 232, and other dimensions can be set without any restrictions, whereby a method for manufacturing the vibration element 1 with a high degree of design flexibility can be provided.

Furthermore, the configuration in which the first protective film 51 and the third protective film 61, which are formed in the first bank forming region Qd1 and the second bank forming region Qd2, respectively, and the second protective film 52 and the fourth protective film 62, which are formed in the first groove forming region Q1 and the second groove forming region Q6, respectively, are each a resin film allows simplification of the first protective film formation step S2, the second protective film formation step S4, the third protective film formation step S8, and the fourth protective film formation step S10.

2. Second Embodiment

A method for manufacturing vibration element 1 according to a second embodiment will be described with reference to FIGS. 17 to 21. The same components as those in the first embodiment have the same reference characters, and no redundant description of the same components will be made.

The second embodiment is the same as the first embodiment except that a first protective film 51a formed in the first bank forming region Qd1 in the first protective film formation step S2 is a metal film, that the first protective film 51a has a first metal film 511 and a second metal film 512, that a third protective film 61a formed in the second bank forming region Qd2 in the third protective film formation step S8 is a metal film, that the third protective film 61a has a third metal film 611 and a fourth metal film 612, that the first metal film 511 is formed in regions other than the first bank forming region Qd1 in the first protective film formation step S2, and that the third metal film 611 is formed in regions other than the second bank forming region Qd2 in the third protective film formation step S8.

The first metal film 511 formed in the first groove forming region Q1 out of the regions excluding the first bank forming region Qd1 corresponds to a fifth protective film 55 in the present disclosure. The third metal film 611 formed in the second groove forming region Q6 out of the regions excluding the second bank forming region Qd2 corresponds to a sixth protective film 65 in the present disclosure. The first metal film 511 formed in the inter-arm region Q4 and the inter-element region Q5 out of the regions excluding the first bank forming region Qd1 corresponds to a seventh protective film 57 in the present disclosure. The third metal film 611 formed in the inter-arm region Q4 and the inter-element region Q5 out of the regions excluding the second bank forming region Qd2 corresponds to an eighth protective film 67 in the present disclosure.

The preparation step S1 is the same as that in the first embodiment and will therefore not be described, and the description will start with the first protective film formation step S2.

First Protective Film Formation Step S2

Figure 17:
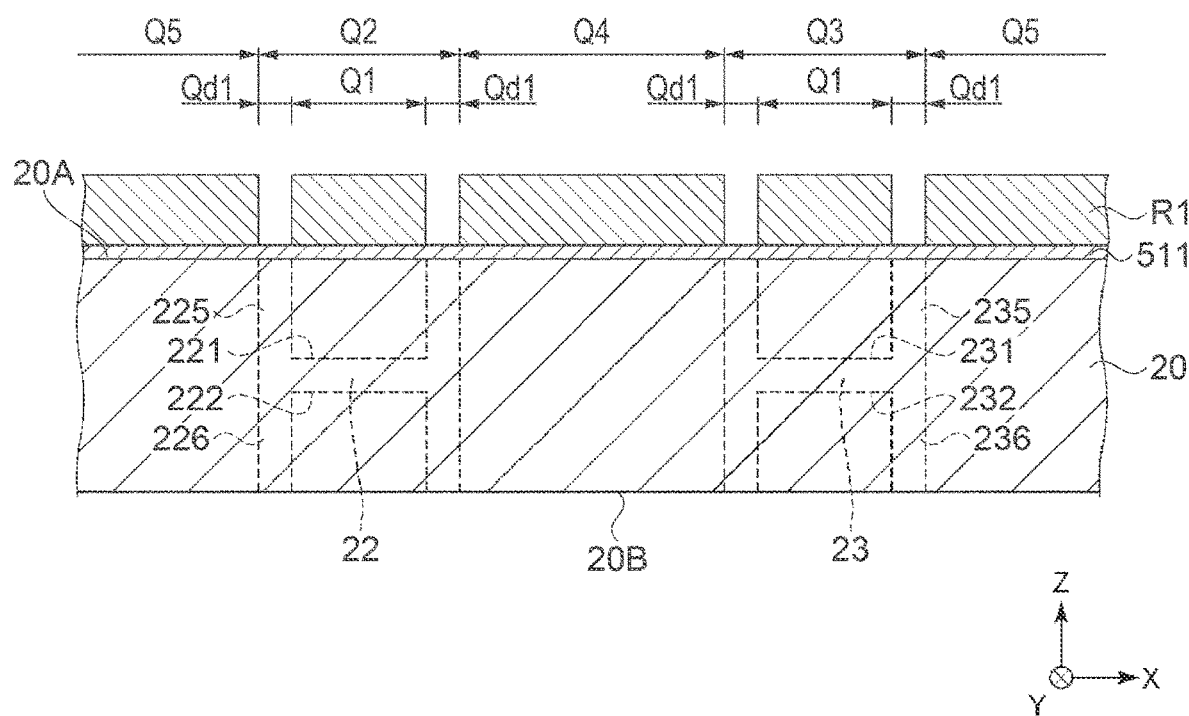
FIG. 17 is a cross-sectional view for describing a method for manufacturing a vibration element according to a second embodiment.

The first metal film 511 is first formed at the first substrate surface 20A of the quartz crystal substrate 20, as shown in FIG. 17. The first metal film 511 is a ground film that facilitates the formation of the second metal film 512, which will be described later. The first metal film 511 can be made, for example, of copper (Cu) or chromium (Cr). The first metal film 511 can be formed, for example, by using vapor phase deposition, such as sputtering and evaporation.

A first resist film R1 is then formed at a surface of the first metal film 511, the surface opposite from the quartz crystal substrate 20, by using a photolithography technique. The surface of the first metal film 511 opposite from the quartz crystal substrate 20 is the surface of the first metal film 511 on the positive side of the direction Z. The first resist film R1 has openings in the first bank forming region Qd1. That is, the first resist film R1 is so patterned that the second metal film 512 can be formed in the first bank forming region Qd1.

The second metal film 512 is then formed on a surface of the first metal film 511, the surface opposite from the quartz crystal substrate 20, via the openings in the first resist film R1. That is, the first resist film R1 is used as a mask, and the second metal film 512 is layered on the first metal film 511. The first protective film 51a including the first metal film 511 and the second metal film 512 is thus formed in the first bank forming region Qd1 of the first substrate surface 20A. The second metal film 512 can be made, for example, of nickel (Ni). The second metal film 512 can be formed, for example, by using electroless plating.

Figure 18:
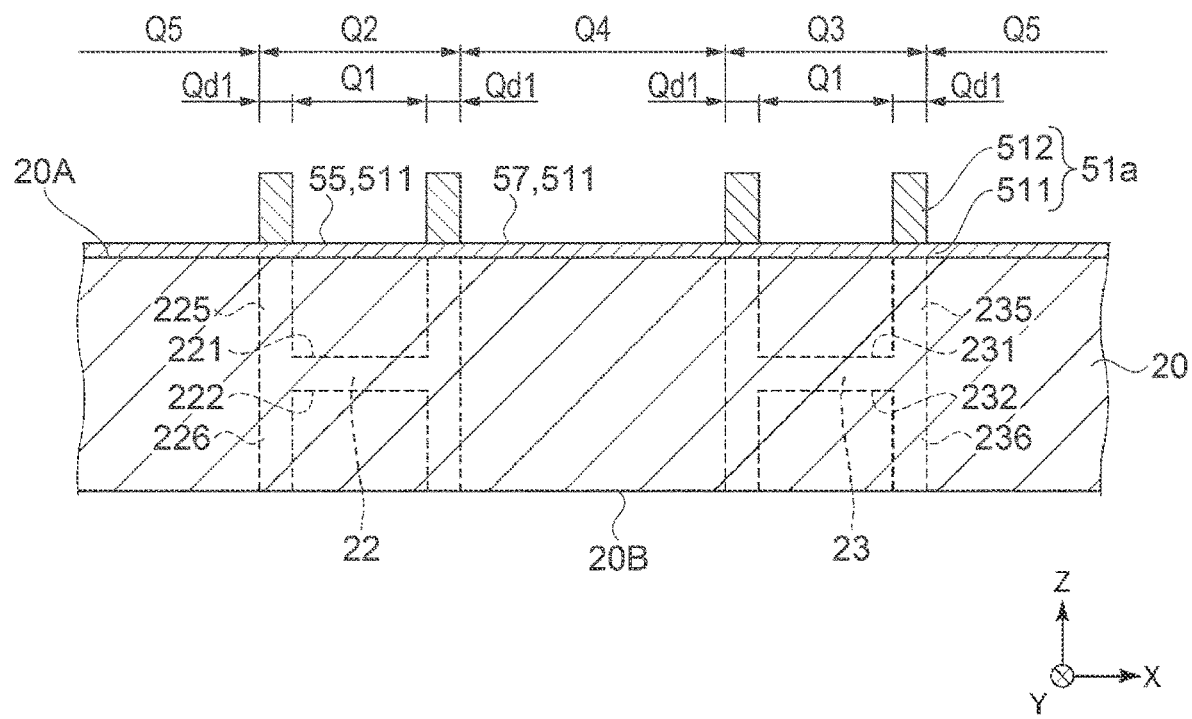
FIG. 18 is a cross-sectional view for describing the method for manufacturing the vibration element.

After the formation of the first protective film 51a, the first resist film R1 is removed. FIG. 18 shows the resultant structure.

The first protective film 51a including the first metal film 511 and the second metal film 512 is formed in the first bank forming region Qd1 of the first substrate surface 20A, as shown in FIG. 18.

In the present embodiment, the thus formed first protective film 51a is so thick as to be left at the first substrate surface 20A when the second dry etching step S5 is completed. The sentence "the first protective film 51a is left" means that "at least part of the first protective film 51a is left". For example, when the second dry etching step S5 is completed, the second metal film 512 out of the first metal film 511 and second metal film 512, which form the first protective film 51a, may be removed.

In the present embodiment, the first protective film 51a is a metal film made of metal. In general, the etching rates at which metals are etched is lower than the etching rates at which photosensitive resins used as resist materials are etched. The configuration in which the first protective film 51a is formed of a metal film therefore allows reduction in the thickness of the first protective film 51a as compared with the case where the first protective film 51a is formed of a resin film. The dimensional accuracy of the first vibrating arm 22 and the second vibrating arm 23, the first grooves 221 and 231, and other portions formed in the first dry etching step S3 can thus be improved.

The first metal film 511 as the fifth protective film 55 is formed in the first groove forming region Q1 of the first substrate surface 20A. The first metal film 511 as the seventh protective film 57 is formed in the inter-arm region Q4 and the inter-element region Q5 of the first substrate surface 20A. The first metal films 511 as the fifth protective film 55 and the seventh protective film 57 are thinner than the first protective film 51a.

First Dry Etching Step S3

Figure 19:
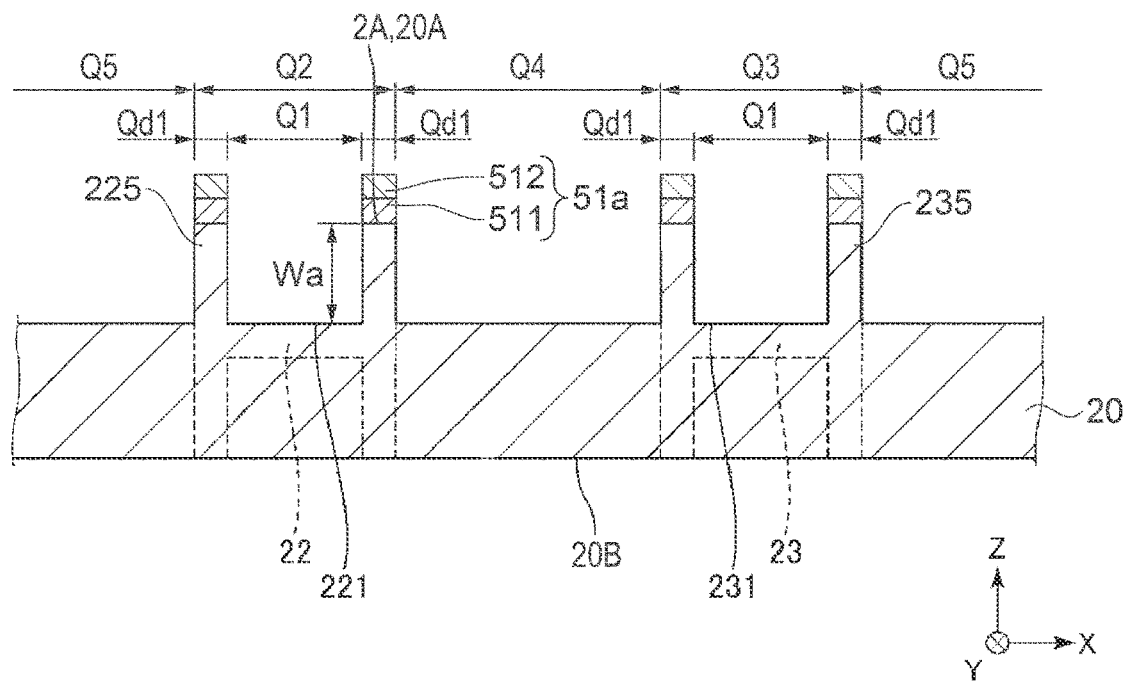
FIG. 19 is a cross-sectional view for describing the method for manufacturing the vibration element.

The quartz crystal substrate 20 is dry-etched from the side facing the first substrate surface 20A via the first protective film 51a, as shown in FIG. 19.

In the present embodiment, the dry etching is initiated with the first metal films 511 formed in the first groove forming region Q1, the inter-arm region Q4, and the inter-element region Q5 of the first substrate surface 20A. The first metal film 511 as the fifth protective film 55 formed in the first groove forming region Q1 and the first metal film 511 as the seventh protective film 57 formed in the inter-arm region Q4 and the inter-element region Q5 are thinner than the first protective film 51a formed in the first bank forming region Qd1. The fifth protective film 55 and the seventh protective film 57 are therefore more readily removed in the first dry etching step S3 than the first protective film 51a.

Therefore, even when the first metal film 511 as the fifth protective film 55 is formed in the first groove forming region Q1, the first grooves 221 and 231 and the outer shape of the vibration substrate 2 can be formed all at once. The step of removing the first metal film 511 as the fifth protective film 55 is therefore unnecessary, whereby the number of steps of manufacturing the vibration substrate 2 can be reduced.

Furthermore, even when the first metal film 511 as the seventh protective film 57 is formed in the inter-arm region Q4 and the inter-element region Q5, the first grooves 221 and 231 and the outer shape of the vibration substrate 2 can be formed all at once. The step of removing the first metal film 511 as the seventh protective film 57 is therefore unnecessary, whereby the number of steps of manufacturing the vibration substrate 2 can be reduced.

Completion of the first dry etching step S3 is followed by the second protective film formation step S4.

The second protective film formation step S4, the second dry etching step S5, the first protective film removal step S6, and the second protective film removal step S7 are the same as those in the first embodiment and will therefore not be described, and the description will start with the third protective film formation step S8.

Third Protective Film Formation Step S8

The present step is executed as the first protective film formation step S2 is.

Figure 20:
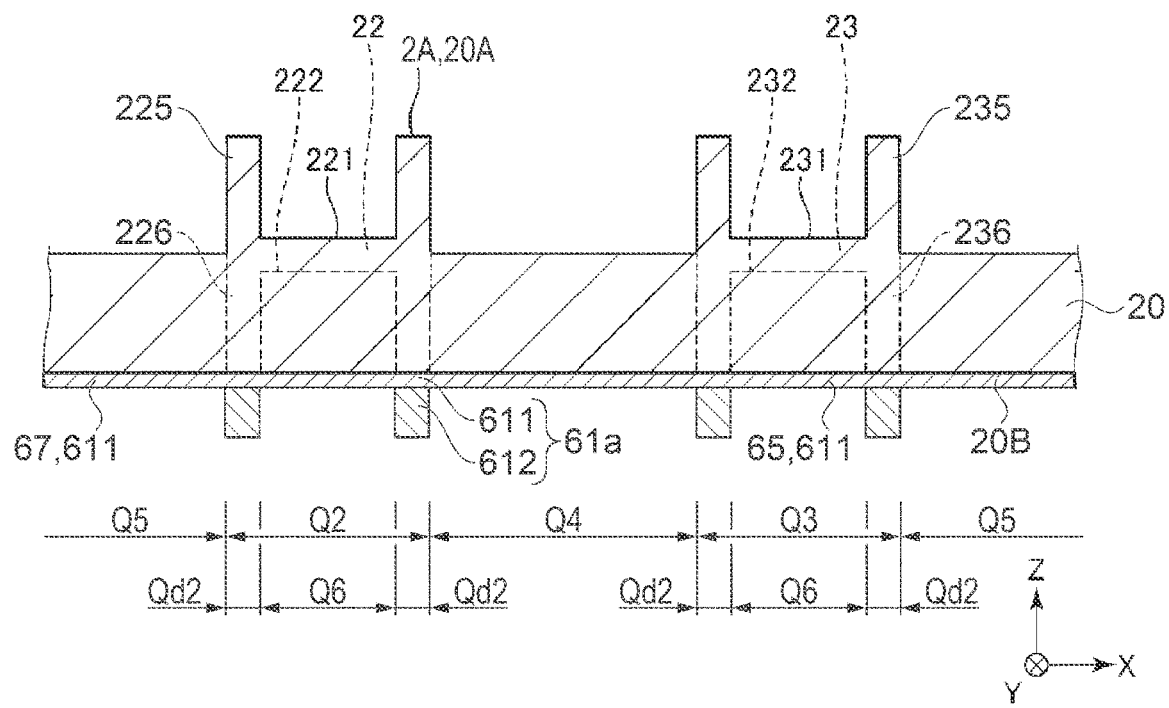
FIG. 20 is a cross-sectional view for describing the method for manufacturing the vibration element.

The third metal film 611 is first formed at the second substrate surface 20B of the quartz crystal substrate 20, as shown in FIG. 20. A second resist film that is not shown is then formed. The second resist film is so patterned that the fourth metal film 612 can be formed in the second bank forming region Qd2. The second resist film is then used as a mask, and the fourth metal film 612 is layered on the third metal film 611. The third protective film 61a including the third metal film 611 and the fourth metal film 612 is thus formed in the second bank forming region Qd2 of the second substrate surface 20B.

After the formation of the third protective film 61a, the second resist film is removed.

In the present embodiment, the third protective film 61a is formed so thick as to be left at the second substrate surface 20B when the fourth dry etching step S11 is completed. The sentence "the third protective film 61a is left" means that "at least part of the third protective film 61a is left". For example, when the fourth dry etching step S11 is completed, the fourth metal film 612 out of the third metal film 611 and fourth metal film 612, which form the third protective film 61a, may be removed.

In the present embodiment, the third protective film 61a is a metal film made of metal. The third protective film 61a can therefore be thinner than the third protective film 61a formed of a resin film. The dimensional accuracy of the first vibrating arm 22 and the second vibrating arm 23, the second grooves 222 and 232, and other portions formed in the third dry etching step S9 can thus be improved.

The third metal film 611 as the sixth protective film 65 is formed in the second groove forming region Q6 of the second substrate surface 20B. The third metal film 611 as the eighth protective film 67 is formed in the inter-arm region Q4 and the inter-element region Q5 of the second substrate surface 20B. The third metal films 611 as the sixth protective film 65 and the eighth protective film 67 are thinner than the third protective film 61a.

Third Dry Etching Step S9

The present step is executed as the first dry etching step S3 is.

Figure 21:
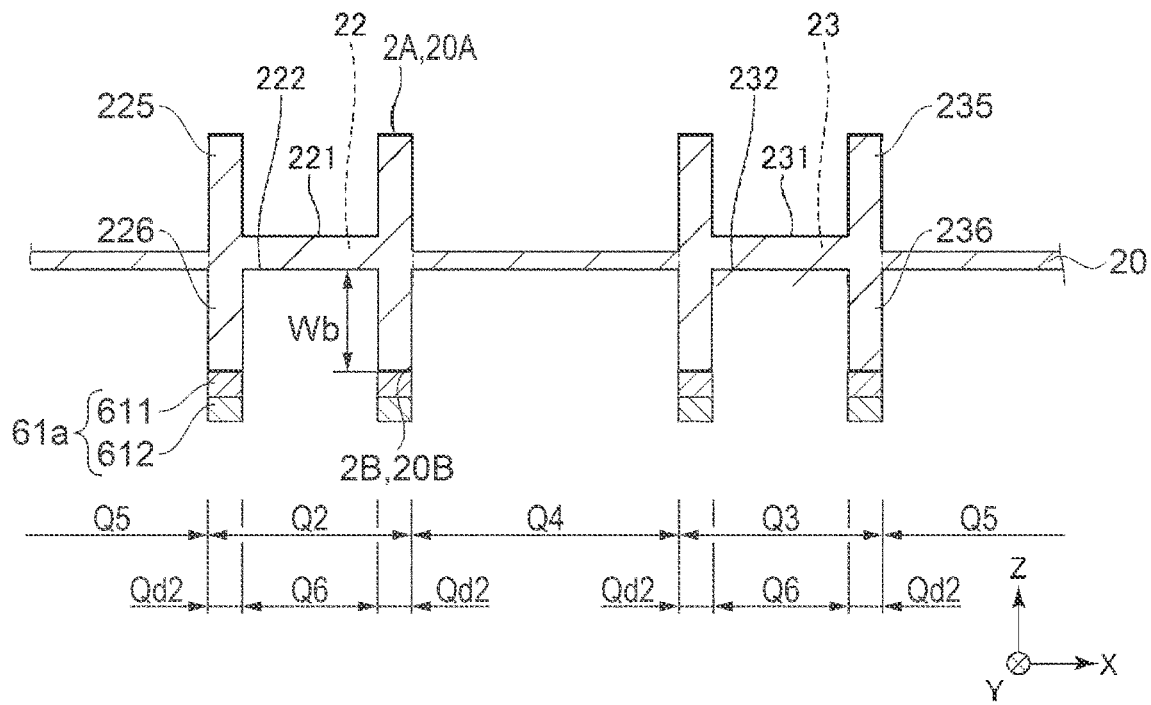
FIG. 21 is a cross-sectional view for describing the method for manufacturing the vibration element.

The quartz crystal substrate 20 is dry-etched from the side facing the second substrate surface 20B via the third protective film 61a, as shown in FIG. 21.

In the present embodiment, the dry etching is initiated with the third metal films 611 formed in the second groove forming region Q6, the inter-arm region Q4, and the inter-element region Q5 of the second substrate surface 20B. The third metal film 611 as the sixth protective film 65 formed in the second groove forming region Q6 and the third metal film 611 as the eighth protective film 67 formed in the inter-arm region Q4 and the inter-element region Q5 are thinner than the third protective film 61a formed in the second bank forming region Qd2. The sixth protective film 65 and the eighth protective film 67 are therefore more readily removed in the third dry etching step S9 than the third protective film 61a.

Therefore, even when the third metal film 611 as the sixth protective film 65 is formed in the second groove forming region Q6, the second grooves 222 and 232 and the outer shape of the vibration substrate 2 can be formed all at once. The step of removing the third metal film 611 as the sixth protective film 65 is therefore unnecessary, whereby the number of steps of manufacturing the vibration substrate 2 can be reduced.

Furthermore, even when the third metal film 611 as the eighth protective film 67 is formed in the inter-arm region Q4 and the inter-element region Q5, the second grooves 222 and 232 and the outer shape of the vibration substrate 2 can be formed all at once. The step of removing the third metal film 611 as the eighth protective film 67 is therefore unnecessary, whereby the number of steps of manufacturing the vibration substrate 2 can be reduced.

Completion of the third dry etching step S9 is followed by the fourth protective film formation step S10.

The fourth protective film formation step S10, the fourth dry etching step S11, the third protective film removal step S12, the fourth protective film removal step S13, and the electrode formation step S14 are the same as those in the first embodiment and will therefore not be described.

The vibration element 1 is thus manufactured.

The present embodiment can provide the following effect in addition to the effects provided by the first embodiment.

The configuration in which the first protective film 51a and the third protective film 61a formed in the first bank forming region Qd1 and the second bank forming region Qd2, respectively, are each a metal film allows improvement in the dimensional accuracy of the first vibrating arm 22, the second vibrating arm 23, the first grooves 221 and 231, the second grooves 222 and 232, and other portions.

The method for manufacturing the vibration element 1 has been described above based on the first and second embodiments. The present disclosure is, however, not limited thereto, and the configuration of each portion can be replaced with any configuration having the same function. Furthermore, any other constituent element may be added to any of the embodiments of the present disclosure. Moreover, the embodiments may be combined as appropriate with each other.

For example, at least one of the first protective film 51, the second protective film 52, the third protective film 61, and the fourth protective film 62 only needs to be a resin film.

Furthermore, for example, at least one of the first protective film 51, the second protective film 52, the third protective film 61, and the fourth protective film 62 only needs to be a metal film.

For example, the seventh protective film 57 may be formed in the inter-arm region Q4 of the first substrate surface 20A, but the eighth protective film 67 may not be formed in the inter-arm region Q4 of the second substrate surface 20B. Instead, the seventh protective film 57 may not be formed in the inter-arm region Q4 of the first substrate surface 20A, but the eighth protective film 67 may be formed in the inter-arm region Q4 of the second substrate surface 20B. That is, at least one of the inter-arm region Q4 of the first substrate surface 20A and the inter-arm region Q4 of the second substrate surface 20B may be exposed. In other words, no protective film may be formed in at least one of the inter-arm region Q4 of the first substrate surface 20A and the inter-arm region Q4 of the second substrate surface 20B.

For example, the seventh protective film 57 may be formed in the inter-element region Q5 of the first substrate surface 20A, but the eighth protective film 67 may not be formed in the inter-element region Q5 of the second substrate surface 20B. Instead, the seventh protective film 57 may not be formed in the inter-element region Q5 of the first substrate surface 20A, but the eighth protective film 67 may be formed in the inter-element region Q5 of the second substrate surface 20B. That is, at least one of the inter-element region Q5 of the first substrate surface 20A and the inter-element region Q5 of the second substrate surface 20B may be exposed. In other words, no protective film may be formed in at least one of the inter-element region Q5 of the first substrate surface 20A and the inter-element region Q5 of the second substrate surface 20B.

The vibration element manufactured in accordance with the vibration element manufacturing method according to the present disclosure is not limited to a specific device.

Figure 22:
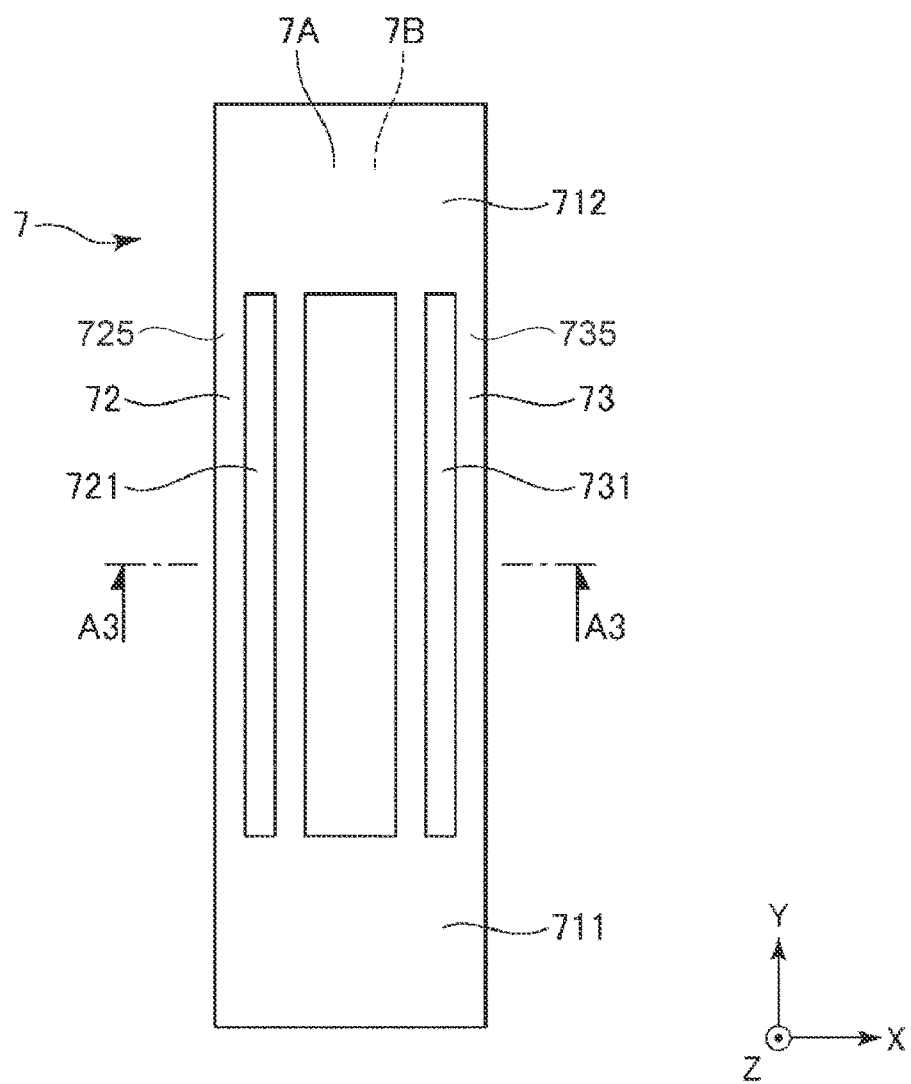
FIG. 22 is a plan view showing a variation of the vibration element.
Figure 23:
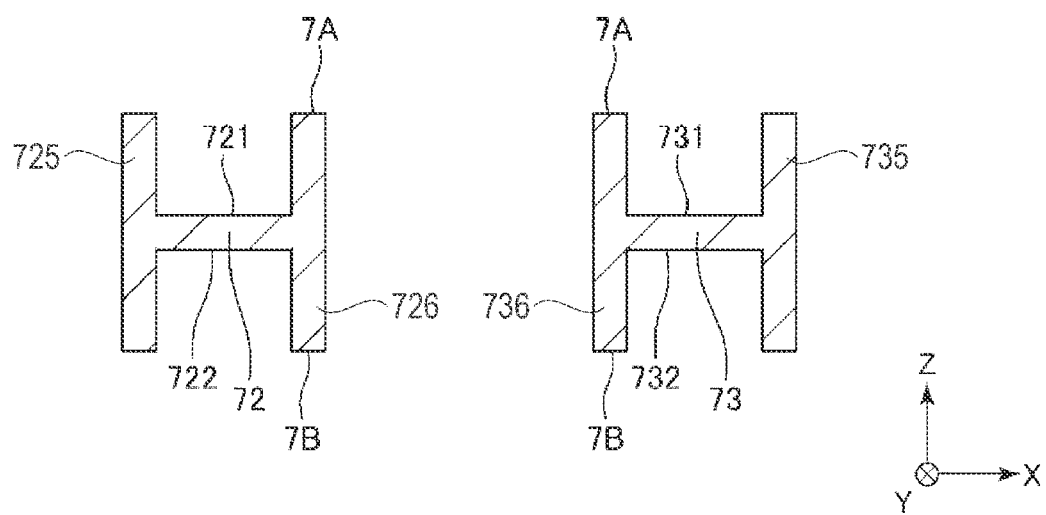
FIG. 23 is a cross-sectional view of the vibration element taken along the line A3-A3 in FIG. 22.

The vibration element manufactured by the vibration element manufacturing method according to the present disclosure may, for example, be a double-tuning-fork-type vibration element 7 shown in FIGS. 22 and 23. Note that no electrode is shown in FIGS. 22 and 23. The double-tuning-fork-type vibration element 7 includes a pair of bases 711 and 712, and a first vibrating arm 72 and a second vibrating arm 73, which link the bases 711 and 712 to each other. The first vibrating arm 72 and the second vibrating arm 73 have bottomed first grooves 721 and 731, which open via a first surface 7A, bottomed second grooves 722 and 732, which open via a second surface 7B, first banks 725 and 735, which define the first grooves 721 and 731, second banks 726 and 736, which define the second grooves 722 and 732.

Figure 24:
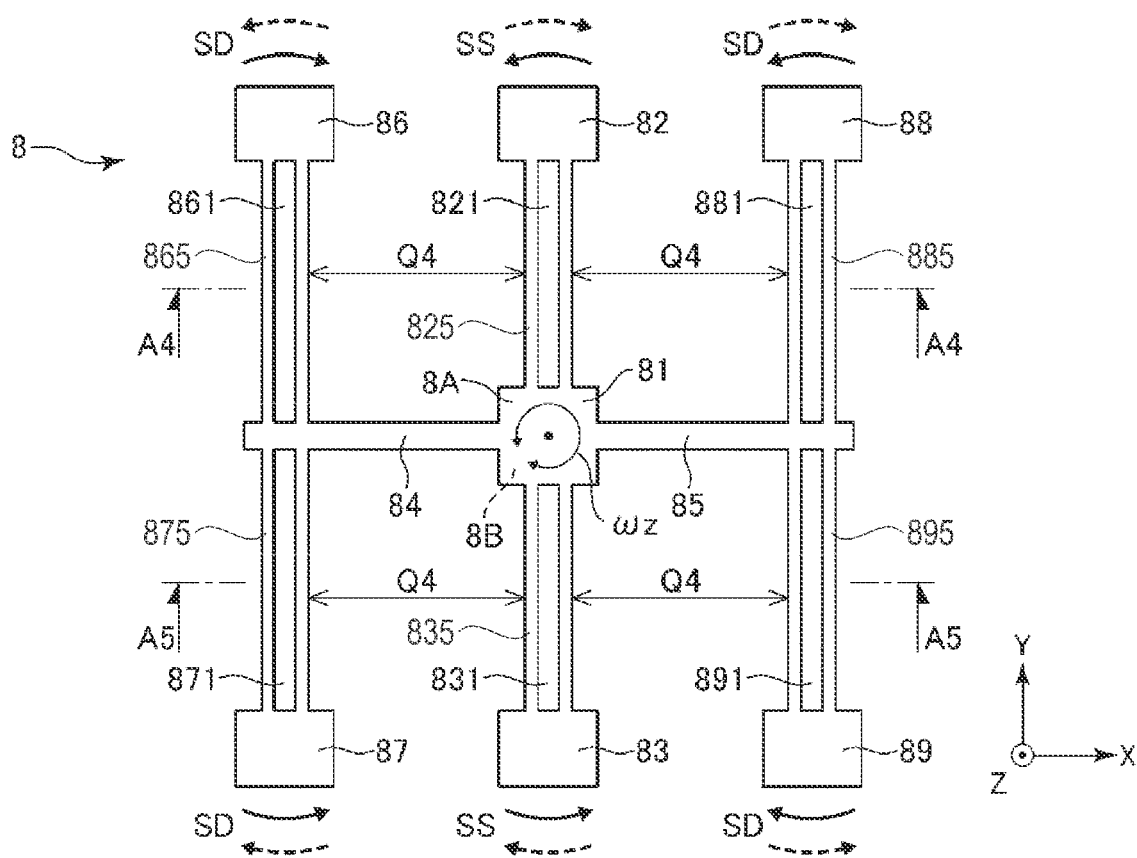
FIG. 24 is a plan view showing another variation of the vibration element.
Figure 25:
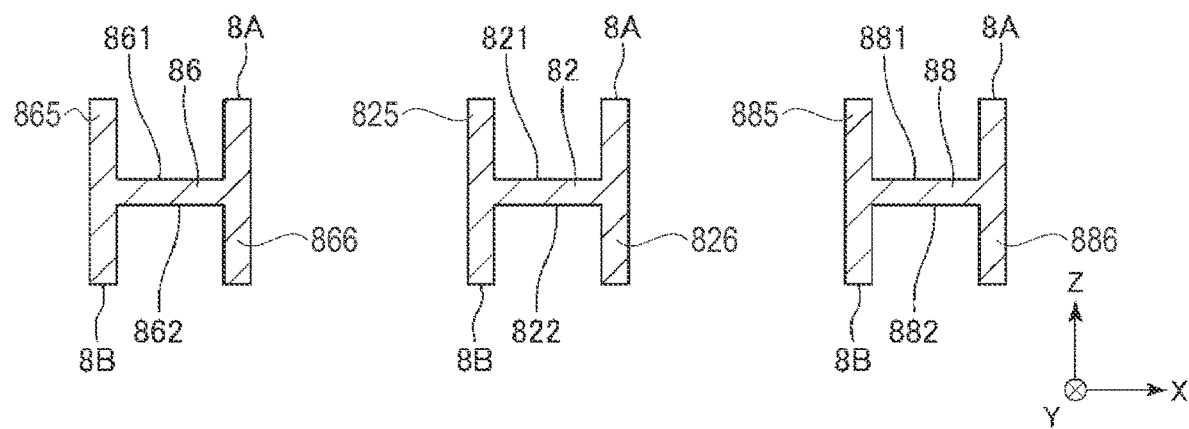
FIG. 25 is a cross-sectional view of the vibration element taken along the line A4-A4 in FIG. 24.
Figure 26:
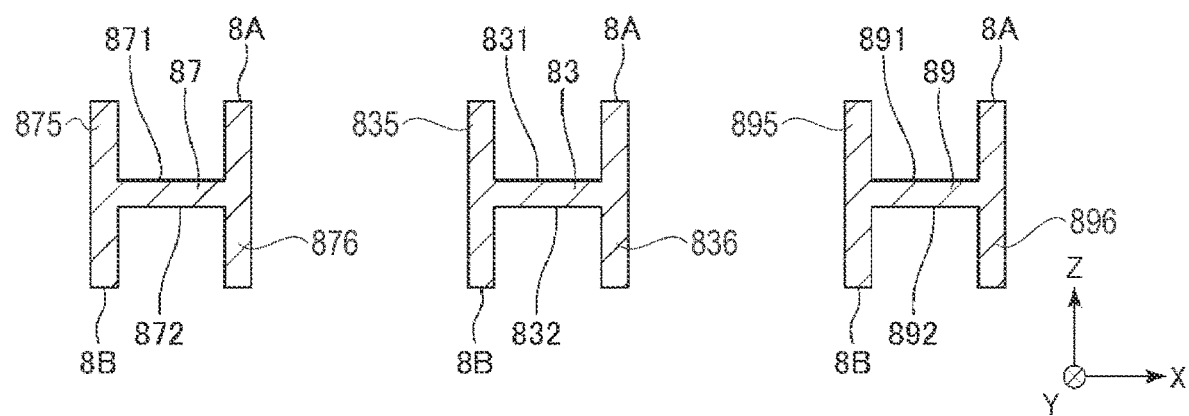
FIG. 26 is a cross-sectional view of the vibration element taken along the line A5-A5 in FIG. 24.

The vibration element may, for example, be a gyro vibration element 8 shown in FIGS. 24, 25, and 26. Note that no electrode is shown in FIGS. 24, 25, and 26. The gyro vibration element 8 includes a base 81, a pair of detection vibration arms 82 and 83, which extend from the base 81 toward opposite sides of the direction Y, a pair of linkage arms 84 and 85, which extend from the base 81 toward opposite sides of the direction X, drive vibration arms 86 and 87, which extend from the tip of the linkage arm 84 toward opposite sides of the direction Y, and drive vibration arms 88 and 89, which extend from the tip of the linkage arm 85 toward opposite sides of the direction Y. When an angular velocity ωz around the axis Z acts on the thus configured gyro vibration element 8 with the drive vibration arms 86, 87, 88, and 89 undergoing flexural vibration in the direction labeled with the arrows SD in FIG. 24, the Coriolis force newly excites flexural vibration of the detection vibration arms 82 and 83 in the direction labeled with the arrows SS, and the angular velocity ωz is detected based on the electric charges outputted from the detection vibration arms 82 and 83 due to the flexural vibration.

The detection vibration arms 82 and 83 have bottomed first grooves 821 and 831, which open via a first surface 8A, bottomed second grooves 822 and 832, which open via a second surface 8B, first banks 825 and 835, which define the first grooves 821 and 831, second banks 826 and 836, which define the second grooves 822 and 832. The drive vibration arm 86, 87, 88, and 89 have bottomed first grooves 861, 871, 881, and 891, which open via the first surface 8A, bottomed second grooves 862, 872, 882, and 892, which open via the second surface 8B, first banks 865, 875, 885, and 895, which define the first grooves 861, 871, 881, and 891, second banks 866, 876, 886, and 896, which define the second grooves 862, 872, 882, and 892. In the thus configured gyro vibration element 8, for example, the drive vibration arms 86 and 88 or the drive vibration arms 87 and 89 form the first and second vibrating arms.

Figure 27:
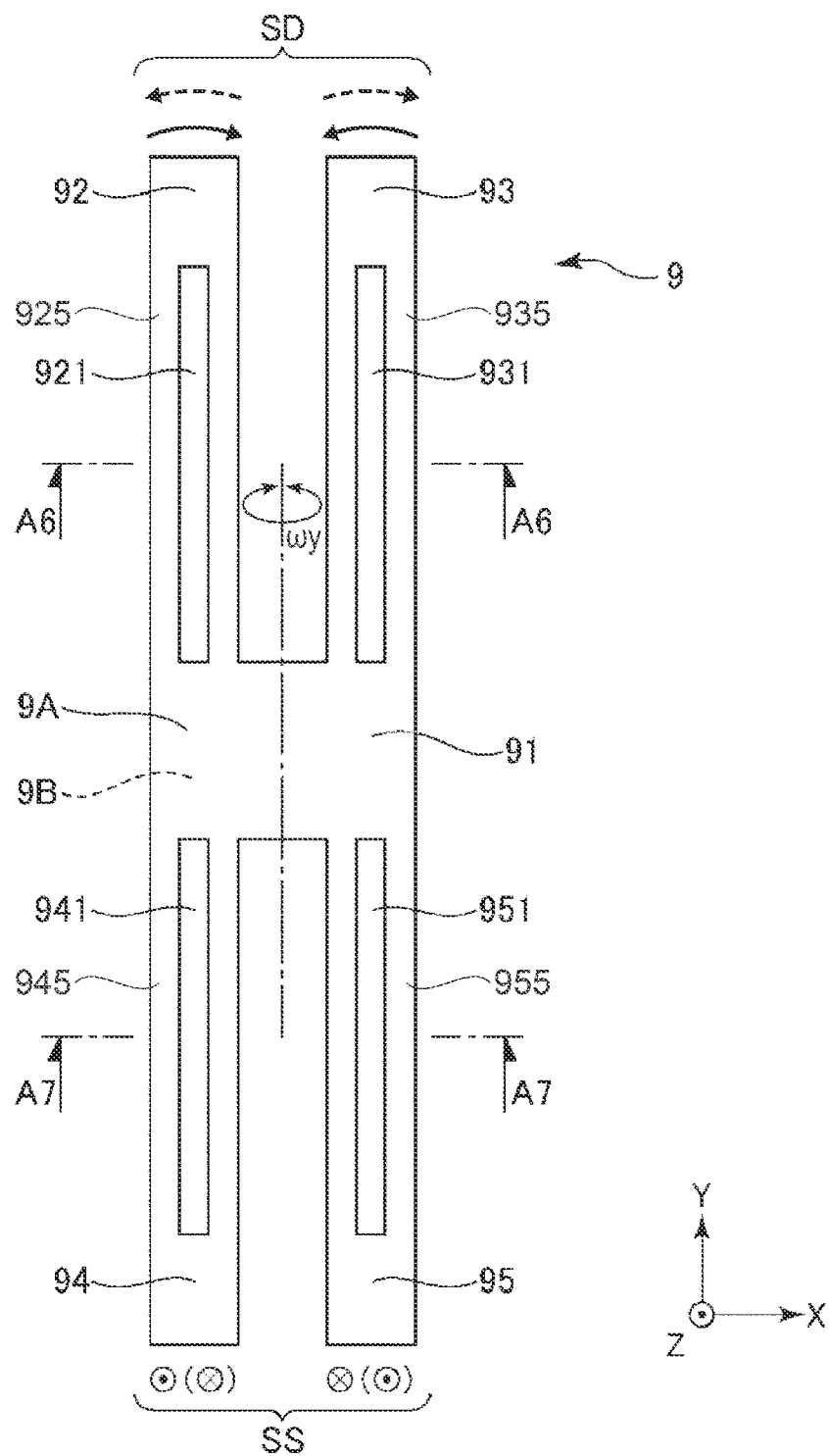
FIG. 27 is a plan view showing another variation of the vibration element.
Figure 28:
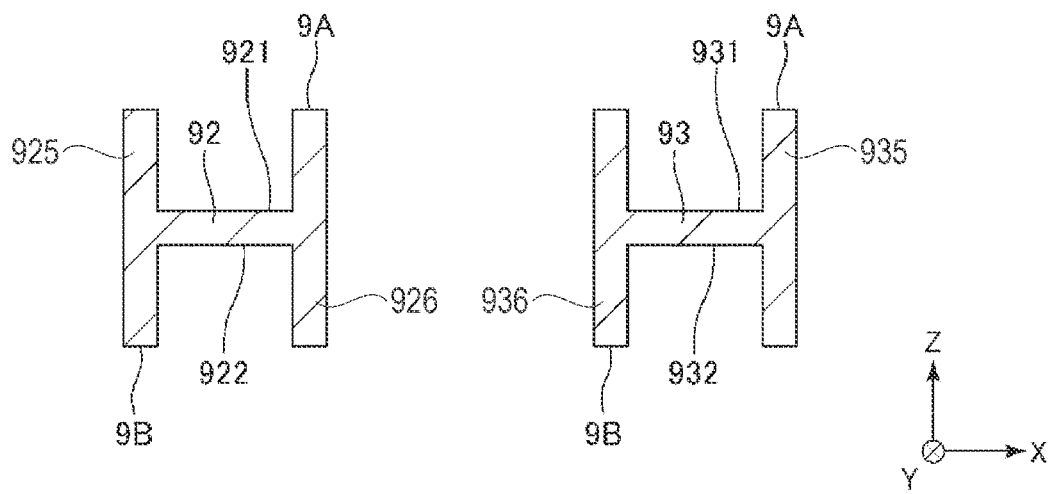
FIG. 28 is a cross-sectional view of the vibration element taken along the line A6-A6 in FIG. 27.
Figure 29:
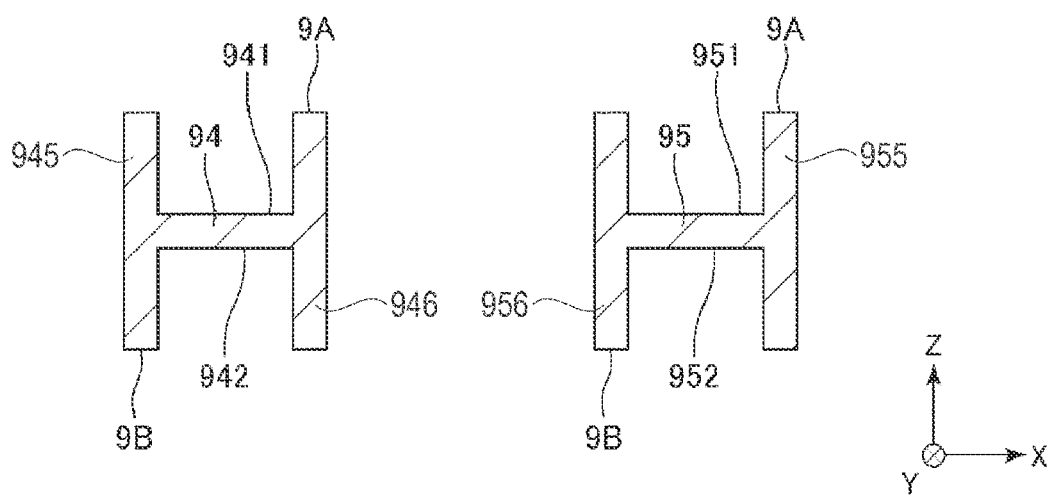
FIG. 29 is a cross-sectional view of the vibration element taken along the line A7-A7 in FIG. 27.

The vibration element may, for example, be a gyro vibration element 9 shown in FIGS. 27, 28, and 29. Note that no electrode is shown in FIGS. 27, 28, and 29. The gyro vibration element 9 has a base 91, a pair of drive vibration arms 92 and 93, which extend from the base 91 toward the positive side of the direction Y and arranged side by side in the direction X, and a pair of detection vibration arms 94 and 95, which extend from the base 91 toward the negative side of the direction Y and arranged side by side in the direction X. When an angular velocity ωy around the axis Y acts on the thus configured gyro vibration element 9 with the drive vibration arms 92 and 93 undergoing flexural vibration in the direction labeled with the arrows SD in FIG. 27, the Coriolis force newly excites flexural vibration of the detection vibration arms 94 and 95 in the direction labeled with the arrows SS, and the angular velocity ωy is detected based on the electric charges outputted from the detection vibration arms 94 and 95 due to the flexural vibration.

The drive vibration arms 92 and 93 have bottomed first grooves 921 and 931, which open via a first surface 9A, bottomed second grooves 922 and 932, which open via a second surface 9B, first banks 925 and 935, which define the first grooves 921 and 931, second banks 926 and 936, which define the second grooves 922 and 932. The detection vibration arms 94 and 95 have bottomed first grooves 941 and 951, which open via the first surface 9A, bottomed second grooves 942 and 952, which open via the second surface 9B, first banks 945 and 955, which define the first grooves 941, and 951, second banks 946 and 956, which define the second grooves 942 and 952. In the thus configured gyro vibration element 9, the drive vibration arms 92 and 93 or the detection vibration arms 94 and 95 form the first and second vibrating arms.

What is claimed is:

1. A method for manufacturing a vibration element including a first vibrating arm and a second vibrating arm that extend along a first direction and are arranged side by side along a second direction intersecting the first direction, the first and second vibrating arms each have a first surface and a second surface arranged side by side in a third direction intersecting the first direction and the second direction in a front and back relationship, a bottomed first groove opening to the first surface, and a bottomed second groove opening to the second surface, the method for manufacturing the vibration element comprising:

providing a quartz crystal substrate having a first substrate surface and a second substrate surface in a front and back relationship, and having a first vibrating arm forming region, a second vibrating arm forming region, a first groove forming region, a second groove forming region, and a inter-arm region located between the first vibrating arm forming region and the second vibrating arm forming region;

forming a first protective film on the first substrate surface in a region excluding the first groove forming region where the bottomed first grooves are to be formed from in the first vibrating arm forming region where the first vibrating arm is to be formed and the second vibrating arm forming region where the second vibrating arm is to be formed;

a first dry-etching of the first substrate surface of the quartz crystal substrate via the first protective film to form the bottomed first grooves and to begin forming outer shapes of the first and second vibrating arms;

forming a second protective film in the bottomed first grooves that were formed during the first dry-etching;

a second dry etching of the first substrate surface of the quartz crystal substrate via the second protective film to form the first surface and to continue to form the outer shapes of the first and second vibrating arms;

forming a third protective film on the second substrate surface in a region excluding the second groove forming region where the bottomed second grooves are to be formed in the first vibrating arm forming region and the second vibrating arm forming region;

a third dry etching of the second substrate surface the quartz crystal substrate via the third protective film to form the bottomed second grooves and to continue to form the outer shapes of the first and second vibrating arms;

forming a fourth protective film in the bottomed second grooves; and a fourth dry etching of the second substrate surface of the quartz crystal substrate via the fourth protective film to form the second surface and to complete formation of the outer shapes of the first and second vibrating arms.

2. The method for manufacturing a vibration element according to claim 1, wherein at least one of the first protective film, the second protective film, the third protective film, and the fourth protective film is a resin film.

3. The method for manufacturing a vibration element according to claim 1, wherein at least one of the first protective film, the second protective film, the third protective film, and the fourth protective film is a metal film.

4. The method for manufacturing a vibration element according to claim 1, wherein a fifth protective film thinner than the first protective film is formed in the first groove forming region during formation of the first protective film, and a sixth protective film thinner than the third protective film is formed in the second groove forming region during formation of the third protective film.

5. The method for manufacturing a vibration element according to claim 1, wherein a seventh protective film thinner than the first protective film is formed in the inter-arm region located between the first vibrating arm forming region and the second vibrating arm forming region of the first substrate surface during formation of the first protective film, and an eighth protective film thinner than the third protective film is formed in the inter-arm region of the second substrate surface during formation of the third protective film.

6. The method for manufacturing a vibration element according to claim 1, wherein no protective film is formed in at least one of the inter-arm region of the first substrate surface and the inter-arm region of the second substrate surface.

7. The method for manufacturing a vibration element according to claim 1, wherein, during the second dry etching, the dry etching is terminated with the first protective film left at the first substrate surface, and the method further comprises removing the left-behind first protective film.

8. The method for manufacturing a vibration element according to claim 7, wherein, during the fourth dry etching, the dry etching is terminated with the third protective film left at the second substrate surface, and the method further comprises removing the left-behind third protective film.

\* \* \* \* \*